United States Patent

Gudesen et al.

[19]

[11] Patent Number: 6,005,791
[45] Date of Patent: Dec. 21, 1999

[54] OPTICAL LOGIC ELEMENT AND OPTICAL LOGIC DEVICE

[76] Inventors: Hans Gude Gudesen, Tyrihansveien 5, N-1639 Gamle Fredrikstad; Per-Erik Nordal, Hestehagen 19, N-1360 Nesbru; Geirr I. Leistad, Jongsstubben 19, N-1300 Sandvika, all of Norway

[21] Appl. No.: 09/011,522
[22] PCT Filed: Jun. 12, 1997
[86] PCT No.: PCT/NO97/00154
§ 371 Date: Mar. 2, 1998
§ 102(e) Date: Mar. 2, 1998
[87] PCT Pub. No.: WO97/48009
PCT Pub. Date: Dec. 18, 1997

[30] Foreign Application Priority Data

Jun. 12, 1996 [NO] Norway ................................ 962475
Jun. 6, 1997 [NO] Norway ................................ 972574

[51] Int. Cl.⁶ .............................................. G11C 13/04
[52] U.S. Cl. .............................................. 365/114; 365/215
[58] Field of Search ............................... 365/114, 115, 365/169, 170, 215

[56] References Cited

U.S. PATENT DOCUMENTS

| | | | |
|---|---|---|---|
| 4,864,536 | 9/1989 | Lindmayer | 365/106 |
| 4,992,654 | 2/1991 | Crossland et al. | 250/214 LS |
| 5,461,507 | 10/1995 | Westland et al. | 359/289 |
| 5,479,384 | 12/1995 | Toth et al. | 364/14 |

OTHER PUBLICATIONS

J. Lindmayer "A New Erasable Optical Memory", Solid State Techn. (Aug. 1988).
R.R. Birge, Ann. Rev. Phys. Chem. 41, pp. 683–733 (1990).
"Stacking the Decks for Optical Data Storage" Optics and Photonics News (Aug. 1994).
D. Psaltis and F. Mok, "Holographic Memories", Scientific American (Nov. 1995).
"The Optical Sugar Cube" Photonics Spectra (Sep. 1994).
WO96/21228—"Branched Photocycle Optical Memory Device", (Birge).
WO95/31515—"Colour Source and Method of its Fabrication" (Anderson et Al.).
M. Berggren et. al., "Light–emitting diodes with variable colours from polymer blends", Nature vol. 372, pp. 444–446 (1994).

*Primary Examiner*—Tan T. Nguyen

[57] ABSTRACT

Addressable optical logic elements contain an optical memory substance, wherein, under the influence of an impressed magnetic, electromagnetic or electrical field or supplied energy, the memory substance can transfer from one physical or chemical state to a second physical or chemical state, wherein a physical or chemical state is assigned a specific logic value, and wherein a change in the logic element's physical or chemical state causes a change in the logic value and is implemented by the logic element being accessed and addressed magnetically, electromagnetically, electrically or optically for writing, reading, storing, erasing and switching of an assigned logic value.

The optical logic device is especially usable for storing data or performing logic and arithmetic operations, wherein the device includes a plurality of optical logic elements, wherein the optical logic elements particularly are multistate, multistable optical logic elements, and even more particularly proximity-addressable optical logic elements, including an optical memory substance, wherein, under the influence of an impressed magnetic, electromagnetic or electrical field or supplied energy, the memory substance can transfer from one physical or chemical state to a second physical or chemical state, wherein a physical or chemical state is assigned a specific logic value, and wherein a change in the logic element's physical or chemical state causes a change in the logic value and is implemented by the logic element being accessed and addressed magnetically, electromagnetically, electrically or optically for writing, reading, storing, erasing and switching of an assigned logic value.

52 Claims, 10 Drawing Sheets

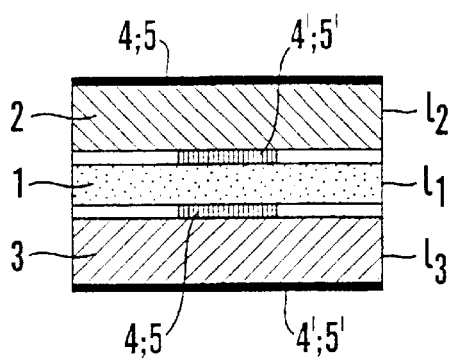
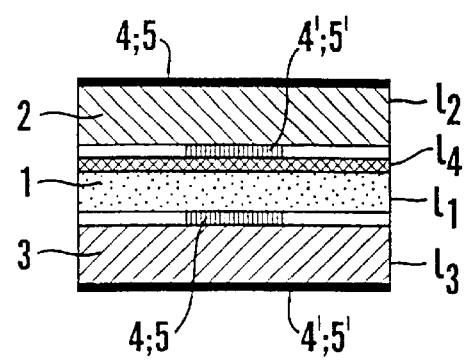
Fig. 6          Fig. 7
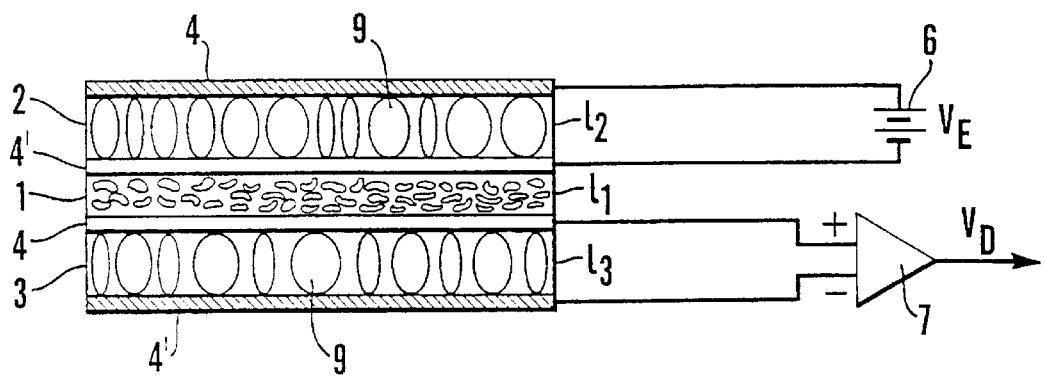
Fig. 8
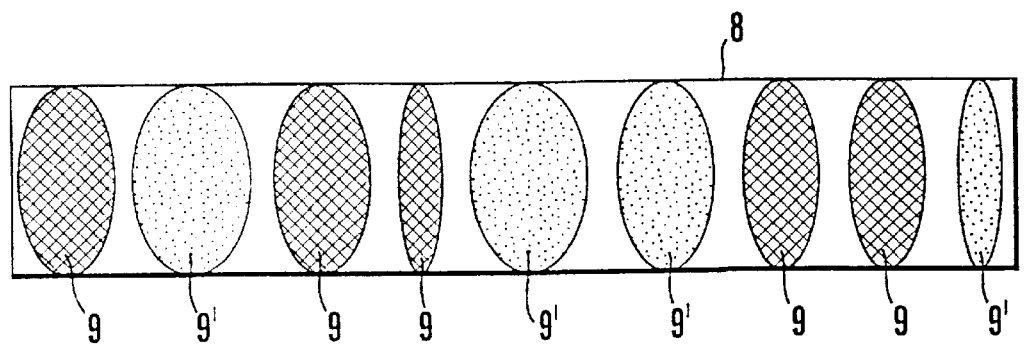
Fig. 10

OPTICAL LOGIC ELEMENT AND OPTICAL LOGIC DEVICE

This application is the national phase under 35 U.S.C. §371 of prior PCT International Application No. PCT/NO 97/00154 which has an International filing date of Jun. 12, 1997 which designated the United States of America, the entire contents of which are hereby incorporated by reference.

FIELD OF THE INVENTION

The invention concerns an optical logic element. More particularly the present application a multistate, multistable optical logic element, and even more particularly a proximity-addressable optical logic element.

BACKGROUND OF THE INVENTION

In general the invention concerns a new class of optoelectronic devices which can store information and/or perform logic functions by means of an optical memory substance which is contained in individually addressable cells or elements. Each element is an independent unit and can be combined with similar elements to form larger assemblies, typically in the form of planar sheets or layers. The latter may be configured in tertiary structures, for example by stacking in order to form optical data memories and optical logic devices with a high performance-to-volume ratio.

Present-day digital optical data storage technologies has been developed in response to an ever-expanding need for data storage capacity in a compact format and they have been remarkably successful in providing solutions which combine a high areal data density with replaceability and/or portability.

The crucial step has been the use of small, efficient semiconductor lasers emitting coherent light which can be focused to near-diffraction-limited spots, thus providing a correspondingly accurate definition and dense arrangement of the information bits in the data carrying medium. In practical systems, cost and space limitations have logically resulted in a design in which the laser beam is scanned across the surface of a rotating disc, picking up a serial bit stream as it follows an optical guidance track under servo control.

Systems based on this generic design have now been refined to a point where the data density is close to the theoretical limit, and further improvements in order to match future demands cannot be met by incremental improvements as in the past.

One obvious limitation is the use of two-dimensional data storage format. Even though the area data density is high, physical bit positions are restricted to a planar surface on a rigid, self-supporting, surface of high mechanical quality, leading to a relatively unimpressive volumetric data density. Technical solutions have recently been published wherein data are stored in several planes at different depths below the surface of the disk. Discrimination between different layers is possible due to the very short depth of field associated with a precise focus and this principle is expected to be developed to encompass up to ten planes or layers (see e.g. E. K.(signature), "Stacking the decks for optical data storage", Optics and Photonics News, August 1994, p. 39). It appears, however, that the benefits reaped from multiple layers or levels are partially neutralized by cost issues as well as technical trade-offs between the number of layers on the one hand and the achievable areal data density in each layer on the other hand. Even when implemented according to the claims set forth, such technological solutions lack the potential for sustained long-term development and improvement.

In many instances limitations in access time and data transfer rates represent a much more serious drawback for rotating disk systems than do the above-mentioned limitations on data densities and capacities.

In applications where files on a disk have to be accessed quickly in random sequence, the laser focusing servo must rapidly move an optical assembly radially from one position on the disk to another. At the correct radial position, tracking must be resumed quickly, involving alignment in two dimensions, adjustment of the spinning speed, establishment of synchronization and finding and identifying the file header. These electromechanical procedures involve access times which are long, typically 200 ms or more. Efforts have been made to reduce the access time, e.g. by increasing the disk rotation speed in order to reduce the time taken for rotational alignment, and reduce the weight of the servo-controlled focusing and tracking components. Improvement in one area, however, carries penalties in another. Increasing the spinning speed aggravates the so-called "whipsaw effect", i.e. the rapid acceleration and deceleration of rotation speed which is required in order to maintain a constant beam scanning speed over the surface of the disk when alternating between tracks at different radii. This is a dominant cause of latency in optical disc-based data retrieval systems. Attempts to eliminate the whipsaw effect by running at constant rotation speed irrespective of radial position lead to a reduction in the area data density or increased technical complexity. It is not surprising that such precision electromechanical optical systems will be slow on timescales which are typical in the purely electronic realm (microseconds or shorter), thus barring optical disk devices from use as direct rapid access memories in a wide range of applications, including as direct random access memories (DRAMs) for computers etc. Considerable efforts have been made to eliminate the Achilles heel of such devices, namely the need for focusing and tracking without mechanical inertia. Solutions which have been investigated include optoelectronic deflectors, waveguides and diffractive optical elements. So far no technical and financially viable systems of this nature have been demonstrated in practice and appear to lie many years in the future. In addition, the latency problem associated with disk rotation is not solved by such measures.

In rotating disksystems the data bits are read consecutively as the laser beam scans along the track, and the data transfer speed is explicitly dependent upon the rotation speed and the linear data density along the track. In a number of applications, such as interactive multimedia, the transfer speed is a significant bottleneck in present-day optical disk systems. Given the near- optimal encoding and focusing of data typical of present-day developments in disktechnology, there seem to be few options available for increasing the data transfer speed. One possibility is to increase the rotation speed. This has been done in several commercial systems to a point where cost and power consumption now lead to a rapidly diminishing return on further speed increases. Another strategy is to employ several laser beams addressing separate, but parallel tracks on the disk. As the number of parallel tracks increases, however, the complexity and cost increase very rapidly, and such schemes seem at best to be destined to provide speed improvements which fall far short of projected future needs.

The above shortcomings have been clearly recognized for a long time, and other schemes have been proposed and experimentally investigated, most notably page-oriented memory and logic systems, based on holographic technology. In addition to promising high density volumetric data storage in three dimensions, holographic systems can be addressed in a page-mode version, thereby offering the advantages which are inherent in parallelism, such as a high transfer speed. Rapid random accessing of data by means of inertia-free optoelectronic means is under investigation. Furthermore, logic operations have been investigated such as high speed parallel processing for object recognition. It has been predicted that holographic memories can be erased and rewritten repeatedly, a data volume at giga- to terabyte level can be stored in a volume comparable to a sugar cube, giving random access times in the micro- to nanosecond range and data transfer speeds of hundreds of Mbyte/s (see e.g. D. Psaltis and F. Mok, "Holographic memories", Scientific American, November 1995, pp. 52–58). Similar potential performances have been mentioned for other systems based on confocal and multilaser (non-linear) addressing principles (see e.g. "The optical sugar cube", Photonics Spectra, September 1994, p. 50).

A further example of a page-based optical data storage system which may be mentioned is internationally published patent application no. W096/2 1228 (Birge) entitled "Branched photocycle optical memory device", which discloses a volumetric optical memory which stores information at high density in three dimensions by selectively activating a photochemical branch reaction from a transitory thermal intermediate state in the primary photocycle in a light-sensitive protein-based storage medium. In this case a so-called "paging" laser is used to activate a planar layer or a page of the data storage medium on one wavelength and data lasers which transmit on another wavelength selected data beams which are orthogonal to the selected layer or page. However, this technology is not easy to implement in practical data storage devices and has some significant weaknesses. In order to obtain high volumetric data density the paging light must be extremely intense and uniform within a very narrowly defined spatial range with a sharp intensity limit. This entails the use of a laser beam and relatively complicated optics in order to form the beam. Secondly, a very precisely controlled illumination sequence is required, involving the use of three separate wavelengths. The optimal time control of the sequences is temperature-dependent. Thirdly, the write and read speeds are limited by the photocycle's time constants, resulting in access times in the ms range. Fourthly, reading of the stored data will reduce the contrast thereof on optical memory media, thus necessitating refreshing after a certain number, for example, 1000 read operations.

In SE patent no. 501 106 (Toth), entitled "Optical memory", there is disclosed an optical memory of the type Write-Once-Read-Many-Times (WORM type) which contains a storage element with stable optical states. The storage element is divided into a number of memory positions, the optical state in a given memory position being capable of being both changed and read out by means of a light beam directed towards the memory position. The memory can be realized entirely without movable mechanical parts and has a very short addressing time, permitting a particularly high storage capacity. This memory also permits parallel writing and reading of multibit words. The actual storage medium may be provided in several layers or levels. The light beam is then focused on a given memory position, and with the use of eight levels it becomes possible to store one byte in each memory position or x,y position. In a design with 7.7 storage cells of each 1 $cm^2$, 9.8 Gbyte can be stored on eight levels and the write speed will then be 40 Mbyte/s. Read-out is performed in absorption mode, which means that the individual levels must have fixed, different thicknesses in order to make it possible to distinguish between the individual levels in the code sequence. This results, however, in a reduction in the volumetric storage density as the number of levels increases, and the necessity of focusing the light beam on a memory position as well as manoeuvring the light beam in the x,y directions entails cost-related and technical complications.

Even though the hitherto proposed technical solutions may appear impressive, in a future commercial environment such performances must be assessed with a view to hardware cost, system complexity and overall device form factor. Based on the current state of the art as revealed in the open literature, it seems correct to conclude that holographic and other page-oriented systems or multilayer systems will not achieve a breakthrough within the foreseeable future in markets where the demand for compactness and low cost is at a premium. Even if components and materials were to become available at acceptable costs, in reality the proposed architectures seem to preclude truly compact solutions.

SUMMARY OF THE INVENTION

The object of the present invention is therefore to overcome the above-mentioned disadvantages in the prior art and proposed solutions and to provide an optical logic element which can be employed in order to realize optical memories, optical logic and arithmetical circuits, optical switches and moreover generally to implement optical data processing equipment at a low cost and technical complexity, but with extremely high storage density, short access time and a very rapid transfer rate.

A further object of the invention is to provide an optical logic element and an optical logic device based on the optical logic element, wherein the optical logic element and the optical logic device appear as a structural and functionally integrated unit, the element's and the device's essential functions all being substantially realized in the element or the device, including functions such as accessing, addressing, activating, switching and detection.

Yet another object of the present invention is to be able to realize volumetric data storage in a simple manner, so that the storage capacity is substantially only dependent on the form factor and becomes inversely proportional to the logic element's physical dimensions.

The above-mentioned and other objects are achieved with an optical logic element which is characterized in that the memory substance is provided in or on a substantially layer-like structure, that an activator which generates a magnetic, electromagnetic or electrical field or supplies energy to the memory substance, is provided in or adjacent to the substantially layer-like structure, and that an optical detector for detection of the memory substance's optical response conditional on the memory substance's physical or chemical state, is provided in or adjacent to the substantially layer-like structure, the optical logic element thus constituting an integrated component consisting of the memory substance, the activator and the detector; together with an optical logic device which is characterized in that the memory substance is provided in or on a substantially layer-like structure, that an activator which generates a magnetic, electromagnetic or electrical field or supplies energy to the memory substance, is provided adjacent to the substantially layer-like structure, that an optical detector for detection of the memory substance's optical response conditional on the memory substance's physical or chemical state, is provided in or adjacent to the substantially layer-like structure, the optical logic element thus constituting an integrated component consisting of the memory substance, the activator and the detector, that the device comprises at least one structure formed by the optical logic elements, that the optical memory substance, the activator and the detector in each logic element in the structure merge into and are connected with the memory substance, the activator and the detector in the surrounding logic elements in the structure, the structure thus forming a flat or curved surface body, each logic element in the structure having an unambiguous assignment between the memory substance and the activator and an assignment between the memory substance and the optical detector for unambiguous detection of a physical or chemical state in the memory substance, thus enabling each optical logic element in the structure to be accessed and addressed individually.

In a preferred embodiment of the optical logic element the memory substance is provided in the form of a first layer, the activator is provided in the form of a second layer adjacent to the first layer or provided integrated in the first layer, and the optical detector which detects the state in the memory substance provided in the form of a third layer adjacent to the first layer, the optical logic element thus forming the integrated component, consisting of at least three or two layers respectively.

Moreover, it is advantageous that the activator is composed of one or more directly or indirectly radiation-emitting means, the radiation-emitting means being provided on or embedded in the base material of the second layer. The radiation-emitting means is advantageously accessed and addressed electrically. It is also advantageous that the radiation-emitting means is a light-emitting diode, preferably a polymer diode.

Moreover, it is also advantageous that the radiation-emitting means is frequency-tunable, the frequency tuning being performed in connection with an electrical addressing. Furthermore, it is advantageous that the optical detector is an electrically accessible and addressable optical detector and that for the electrical accessing and addressing of both activator and detector, electrodes and electrical conductors are provided integrated in the second and the third layer. For this purpose it is advantageous that the electrodes and electrical conductors are based on an electrically conductive polymer material.

In a preferred embodiment of the optical logic device the memory substance in each logic element is provided in the form of a first layer, the activator provided in the form of a second layer adjacent to the first layer or provided integrated in the first layer, and the optical detector which detects the state if the memory substance is provided in the form of a third layer adjacent to the first layer, the optical logic element thus forming the integrated component, consisting of at least three or two layers respectively, and that each of the layers merges with and is connected with the corresponding layer in the surrounding logic elements the structure, thus forming a flat or curved surface body of connected and mutually adjacent respective layers.

Each structure in the optical logic device is preferably in the form of a thin flexible film.

In a particularly preferred embodiment of the invention the optical logic device comprises two or more conjoined structures stacked on top of one another, the optical logic device thus forming a chip- or disk-like component integrated from a plurality of structures.

In a variant of the optical logic device according to the invention a structure is preferably configured in its entirety or partly as an optical memory, each optical logic element in the memory constituting a memory element which can be accessed and addressed individually. In a second variant of the optical logic device according to invention a structure is preferably partly configured as optical logic or arithmetic circuits or networks of such circuits, each of the optical logic elements in the circuits constituting a switching element which can be accessed and addressed individually. In a third variant of the optical logic device according to the invention groups of the optical logic elements in a structure are configured as memory registers, logic registers and arithmetic registers respectively, each optical logic element (OLE) in a register and each register being capable of being accessed and addressed individually, and in such a manner that the resisters can be jointly configured as an optical data processor. Finally, in the optical logic device it is preferred that the accessing and addressing of the logic elements should be performed via multiplexed communication lines assigned to the structure.

Further features and advantages of the present invention are presented in the remaining, appended claims.

BRIEF DESCRIPTION OF THE DRAWINGS

The invention will now be explained in more detail by means of embodiments and with reference to the accompanying drawing.

FIGS. 6, 7 show further preferred embodiments of the optical logic element in FIG. 1, FIG. 8 shows a particularly preferred embodiment of the optical logic element in FIG. 1, FIGS. 9a, 9b, and 9c show the spectral properties of light-emitting polymer diodes, FIG. 10 shows a schematic illustration of a light-emitting polymer diode.

DETAILED DESCRIPTION OF PREFERRED EMBODIMENTS

Figure 1A:
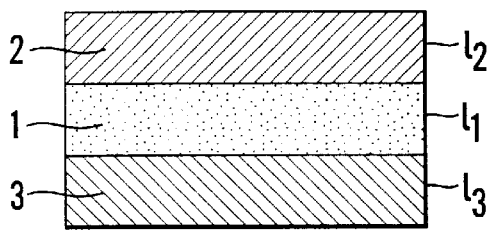
FIG. 1a shows an optical logic element according to the present invention.

FIG. 1a shows a schematic illustration of a preferred embodiment of the optical logic element according to the present invention. A memory substance 1 is provided in a first layer $l_1$, the activator 2 which can generate a magnetic, electromagnetic or electrical field or supply energy to the memory substance 1 is provided in the layer $l_2$ on one side of the layer $l_1$, while the detector 3 is provided in the layer $l_3$ on the opposite side of the layer $l_1$. The layers $l_1, l_2, l_3$ may in their entirety comprise the memory substance 1, the activator 2 and the detector 3 respectively, but it should also be understood that the layers $l_1, l_2, l_3$ may be formed from a base material and that the memory substance 1, the activator 2 and the detector 3 respectively maybe embedded in or provided thereon.

Figure 1B:
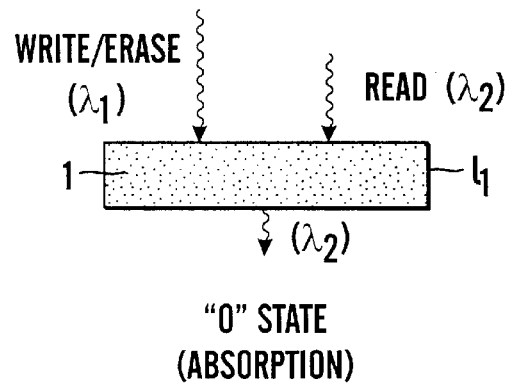
FIGS. 1b and 1c show the optical logic element's operation as a binary logic cell.
Figure 1C:
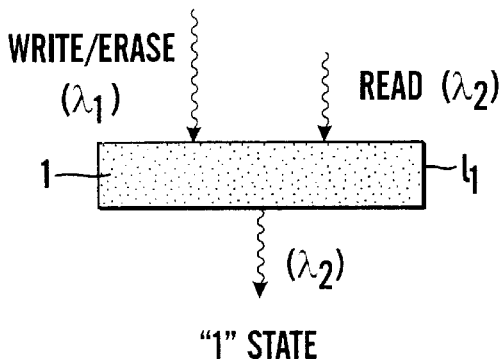
Figure 1D:
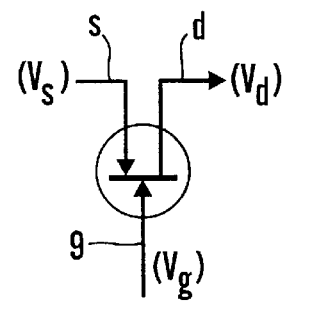
FIG. 1d shows a field-effect transistor for the sake of comparison.

FIG. 1b shows a symbolic representation of the operation of the optical logic element OLE according to the invention during writing, reading and detection of a logic state 0. In this case energy is supplied to the memory substance 1 in the form of light of a first wavelength $\lambda_1$, while reading is performed by absorption of light of a second wavelength $\lambda_2$. The detected light which indicates the logic state 0 is indicated by a shorter photon symbol in order to indicate reduced intensity due to absorption. FIG. 1c is a similar schematic illustration of the mode of operation of the optical logic element OLE during detection of a logic state 1, i.e. no absorption takes place in the memory substance 1 in the layer $l_1$. FIG. 1d is a schematic illustration of an n-channel power transistor in order to indicate the analogy between the optical logic element according to the present invention and an electronic switching device. The absorption of the read light for the logic states 0 and 1 corresponds to the field-effect transistor's drain voltage $V_d$.

Figure 2:
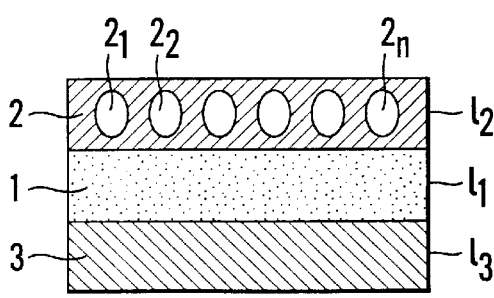
FIG. 2 shows a preferred embodiment of the optical logic element.
Figure 3:
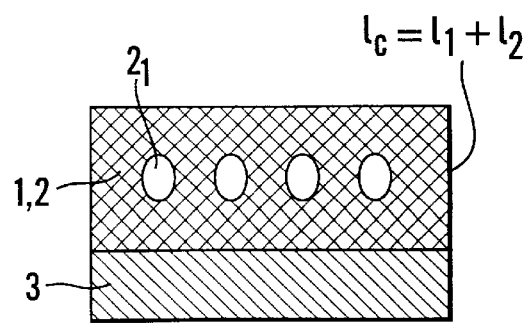
FIG. 3 shows a second preferred embodiment of the optical logic element.

FIG. 2 shows an embodiment where there are included in the activator 2 one or more direct or indirect radiation-emitting means $2_1, \ldots, 2_n$ which are provided in the layer $l_2$. In FIG. 2 the radiation-emitting means $2_1, \ldots$ are provided embedded in a base material in the layer $l_2$, but they could also be provided on the layer $l_2$. In a preferred embodiment the layers $l_1$ and $l_2$ can be combined to form a common layer $l_c$. This layer will then include both the memory substance 1 and the activator 2 with radiation-emitting a means $2_1, \ldots$. This embodiment may be advantageous if the activator is destroyed during writing to the logic element OLE, and this may be relevant if it has to form part of a storage device of the ROM or WORM type and therefore not intended to be erased and/or rewritten.

The optical memory substance 1 shall be light-sensitive and able to exist in two or more distinct physical states, as indicated in FIGS. 1b and 1c. It shall be possible to determine these physical states by means of the response of the states to an incident probe light or read light. The logic state can be found by exciting the activator differently, e.g. according to a specific read protocol, whereby memory substance 1 responds to the incident light by a logic-state-dependent optical transmission or emission of light.

The basic properties of the optical logic element OLE are explicitly dependent on the write/read characteristics of the memory substance. Changes in the memory substance during the write process may be irreversible, resulting in an optical logic element which realizes memory functions of the ROM and WORM type. However, the description below will focus on memory substances which are non-volatile, but reversible, i.e. they remain in a generated logic state until acted upon by writing, reading or erasing light. They can, however, be deleted, erased and rewritten many times by irradiation with light. Another important characteristic of the memory substance is whether it can carry multilevel information, i.e. information which is greyscale encoded, or whether it responds to a read protocol of a binary nature, i.e. either with logic state 0 or 1.

Even though the memory substance 1 as described above, is brought from one physical/chemical state to another by the application of light, this does not rule out the use according to the invention of other forms of energy to influence the state of the memory substance. This may involve magnetism, electromagnetism or electronic fields or supplying energy in the form of heat. This may be appropriate if there is a requirement to produce dark reactions in process steps between logic states in the memory substance, for example the application of heat for erasing information, or for generating conditions which cause the incident light to have an effect, e.g. the application of an electrical field to shift an absorption band if the memory substance is a light-sensitive material which absorbs on specific wavelengths.

From the facts stated above it will be evident that the optical logic element according to the invention obtains its basic properties from the memory substance. Two types of memory substances will now be described both of which are reversible, i.e. they can circulate more than once through their logic states by employing suitable protocols for writing, reading and erasing.

Electron trapping materials are typically obtained from organic semiconductor materials which are doped with rare earth ions. Electron trapping materials can be used for storing data at high density and provide high data transfer and recovery rates. Reference may here be made to an article of J. Lindmayer, "A new erasable optical memory", Solid State Technology, August 1988.

Figure 4:
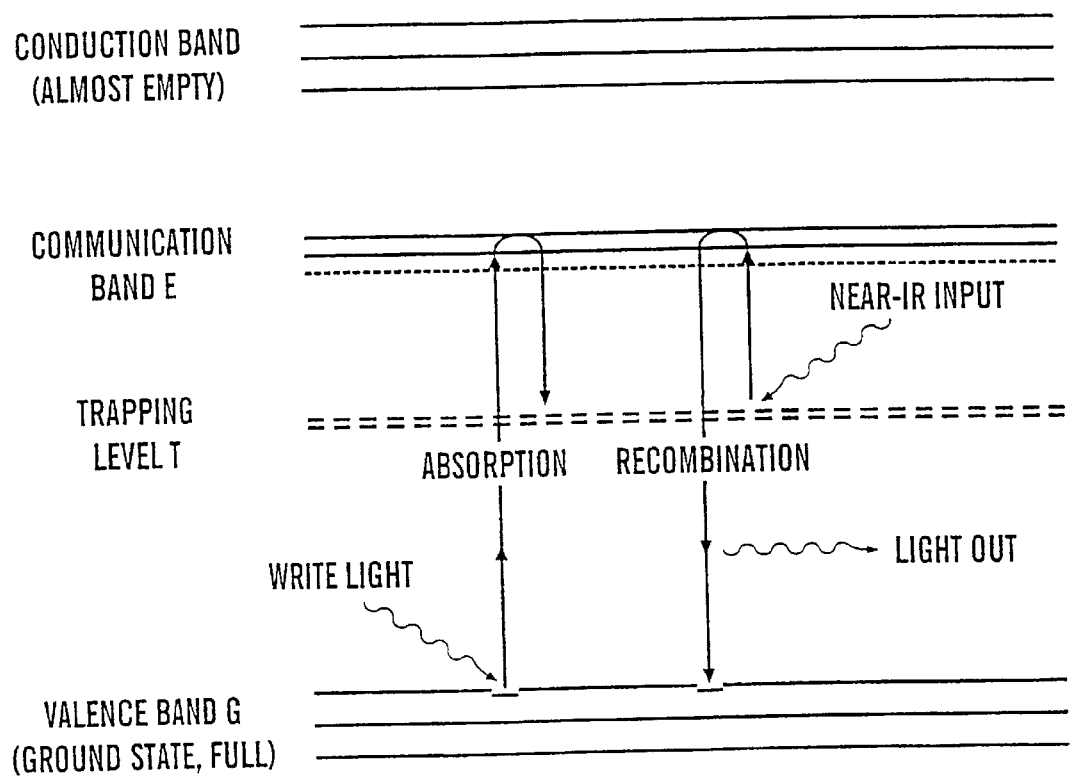
FIG. 4 shows the principle of a memory substance in the form of an electron trapping material.

A general illustration of the mode of operation of an electron trapping material is given in FIG. 4. Writing is performed by capture taking place at the energy levels E and T. When the write light excites atoms of two rare earth metals employed as dopants, their electrons are raised to the energy level E, which exists in both types of atoms, and are subsequently captured at the level T, which exists in only one of the atoms. Exposure to light in the near infrared range at the level T raises the electrons to the communication band, from where they fall to the ground state, resulting in an erasure of data.

Electron trapping materials may have a host lattice in the form of alkaline earth sulphide, such as Cas, SrS, MgS or a mixture thereof. When the rare earths europium and samarium are employed as dopants, the memory substance absorbs incoming light at 450–550 nm, whereby the europium ions absorb photon energy and transfer part of it to the samarium ions. The latter are thus excited to trapping states, so called because these states are stable, i.e. the samarium ions will be stable for very long periods unless lifted out of the trap through the absorption of appropriate quanta of energy. The latter will be the case when the memory substance is irradiated by light at the wavelengths 850–1200 mn, thus stimulating the samarium ions in trapping states, and the released electrons emit light at the wavelengths 600–700 nm upon returning to the ground state. Thus in this case writing is performed by irradiation with light at the wavelengths 450–550 nm, while reading is performed by illumination with light at the wavelengths 850–1200 nm with simultaneous detection of fluorescence at the wavelengths 600–700 nm.

Instead of an electron trapping material the memory substance could be a conformation-reactive material and particularly a light-sensitive conformation-reactive material which can pass through a photocycle. Examples of such materials are certain types of dye proteins. A protein of this kind which has been relatively well studied is bacteriorhodopsin, which occurs in the membrane of a microorganism, Halobacterium salinarium. For a closer discussion of the bacteriorhodopsin's properties with a view to optical storage of data, reference should be made to NO patent application no. 97 2574 from which the present application derives priority and which is assigned to the present applicant.

When bacteriorhodopsin absorbs light, it passes through a photocycle which generates intermediate states with absorption maxima in the entire visible range of the electromagnetic spectrum. This is illustrated schematically in FIG. 1a which presents the bacteriorhodopsin's photocycle and indicates the sequence of structural changes which are induced by the light. Light-induced transitions or excitation transitions are indicated by shaded arrows, while unshaded arrows indicate transitions due to thermal relaxation. Green light converts the bacteriorhodopsin's ground state bR to an intermediate state K which subsequently relaxes, forming the M state and then the O state. The residence time in the M state depends, amongst other things, on both the temperature and the mutant of bacteriorhodopsin employed. If the bacteriorhodopsin in the O state is exposed to red light, a so-called branch reaction occurs. The O state passes to the P state which quickly relaxes into the Q state, a form of the bacteriorhodopsin which has been shown to be stable over a very long period. In different mutants of bacteriorhodopsin which employ aspartic acid residues 85 and 96, the lifetime of the Q state can be extended to several years. If aspartic acid 85 is replaced by a non-polar amino acid such as aspargine, the formation of a stable M state is prevented and the primary photocycle forms the O state (or an intermediate state very like the O state very rapidly (R. R. Birge, Ann. Rev. Phys. Chem., 41, pp. 683–733 (1990)). If, however, the bacteriorhodopsin is illuminated in the Q state with blue light, it returns to the ground state bR. If the O state is not illuminated with red light, within a short time it will relax back to the ground state bR. Any two states with a long lifetime can now be assigned the binary logic value 0 or 1, thus enabling information to be stored in bacteriorhodopsin molecules which are in one or the other of these states.

Figure 5A:
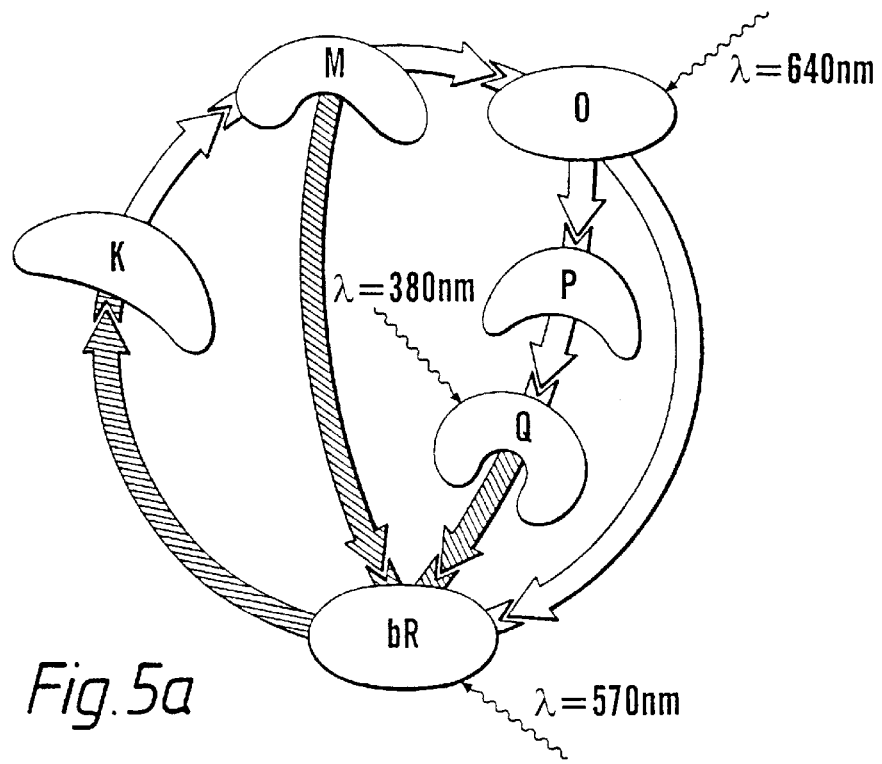
FIGS. 5a–d show the principle of a memory substance in the form of a light-sensitive conformation-reactive material, in this case bacteriorhodopsin.
Figure 5B:
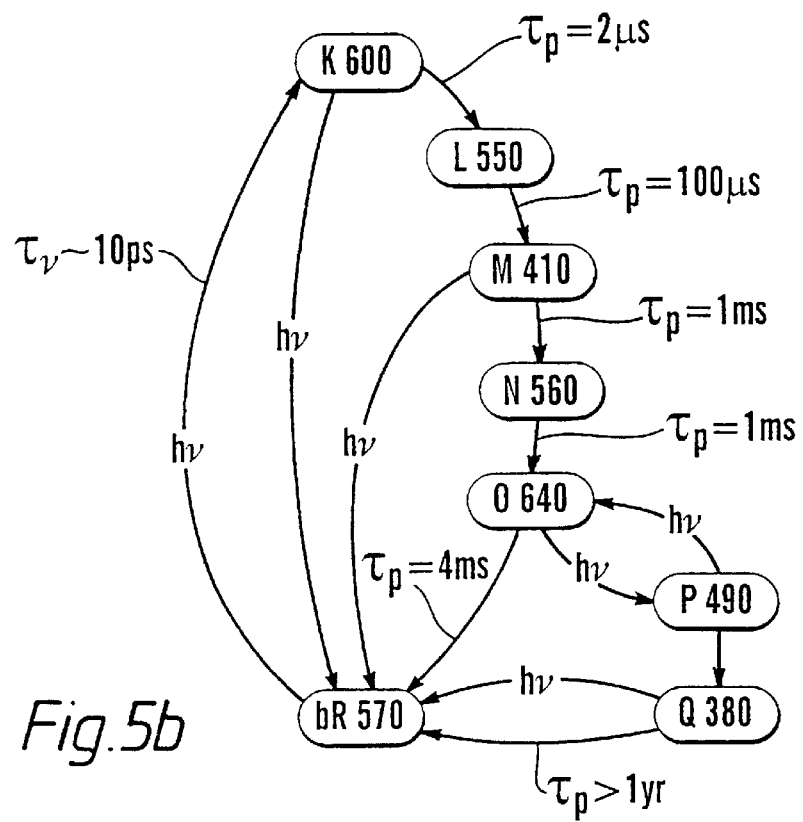

FIG. 5b is a diagram of the bacteriorhodopsin's primary photocycle. The central photochemical transformations which are relevant for use in an optical logic element according to the present invention are indicated in the diagram in a sequence which generally goes round the diagram in a clockwise direction. bR denotes the bacteriorhodopsin's ground state, and large letters indicate the different states in the photocycle. The numbers in brackets denote the centre wavelengths of the absorption bands for the different states or species of bacteriorhodopsin in nanometers. Transitions which are effected by a photo-induced excitation are denoted by hv and possibly by time constants $\tau_\upsilon$, while ransitions which are due to thermal reactions are indicated by the time constants $\tau_\rho$ for first order relaxation times at approximately room temperature. Illumination of bacteriorhodopsin molecules in the ground state or the rest state bR with the light centred around 570 nm produce the excitation state K which has a very short lifetime. As will be seen, the K state has an absorption bandwidth which is centred on 600 nm, implying that if the effective bandwidth extends to over 600 nm on excitation from the bR state, molecules in the K state will return to the ground state bR. This transition, however, has assumed low quantum efficiency, and since the K state is unstable and very quickly passes to the L state, most of the molecules in the K state will be forced on in the photocycle, even though some molecules will circulate back to the ground state bR. The intermediate state M which has an absorption band centred on 410 nm, will in the course of a short period of circa 1–3 ms relax thermally to the intermediate state N which in turn relaxes thermally to the intermediate state O. As stated, in various modifications of the bacteriorhodopsin the M state can have a relatively long lifetime, up to several minutes and could therefore possibly be used to represent one of the logic states 0 or 1 if archival storage over very long periods is not essential. At this point it can be mentioned that the M state actually consists of two states $M_1$ and $M_2$ which have virtually identical absorption spectra. In addition, during previous attempts at holographic data storage in bacteriorhodopsin by means of the M state, a gradual loss of sensitivity and contrast was observed, which was subsequently proved to be due to loss of active molecules during the branch reaction to the P and the Q state (R. R. Birge, private communication, 1996). It can be seen in the diagram that the M state returns to the ground state when illuminated by light centred around the M state's absorption centre wavelength of 410 nm. Light centred around the absorption centre wavelength of the ground state bR, viz. 570 nm, however, naturally will not force the M state back to the bR state. The O state has an absorption centre wavelength of 640 nm and will therefore, if illuminated by light with an effective bandwidth centred around this wavelength, thus causing a branch reaction in the photocycle, pass to an intermediate state P which has a relatively long lifetime, up to several minutes. The P state will thermally relax into the most stable of the photocycle's intermediate states, viz. the Q state, which has a lifetime which probably extends over several years. The Q state can therefore be employed to represent a logic state which has to be maintained for years. Besides the stable ground state bR, therefore, the Q state is the state which is best suited when bacteriorhodopsin constitutes the storage medium in those cases where the optical logic element according to the invention has to be employed in an optical data storage device which is suitable for archival storage.

If the Q state is illuminated by blue light with an effective bandwidth centred on the Q state's absorption centre wavelength of 380 nm, the Q state passes to the ground state bR, while the time indication ">1 year" indicates that the Q state too will thermally relax into the ground state bR, but with a time constant which in this case is many years. By means of absorption of light with an effective bandwidth centred round the P state's absorption centre frequency of 490 nm, the P state may return to the O state. Moreover, in the normal photocycle, the O state relaxes thermally back to the ground state bR with a time constant of about 4 ms at room temperature.

Figure 5C:
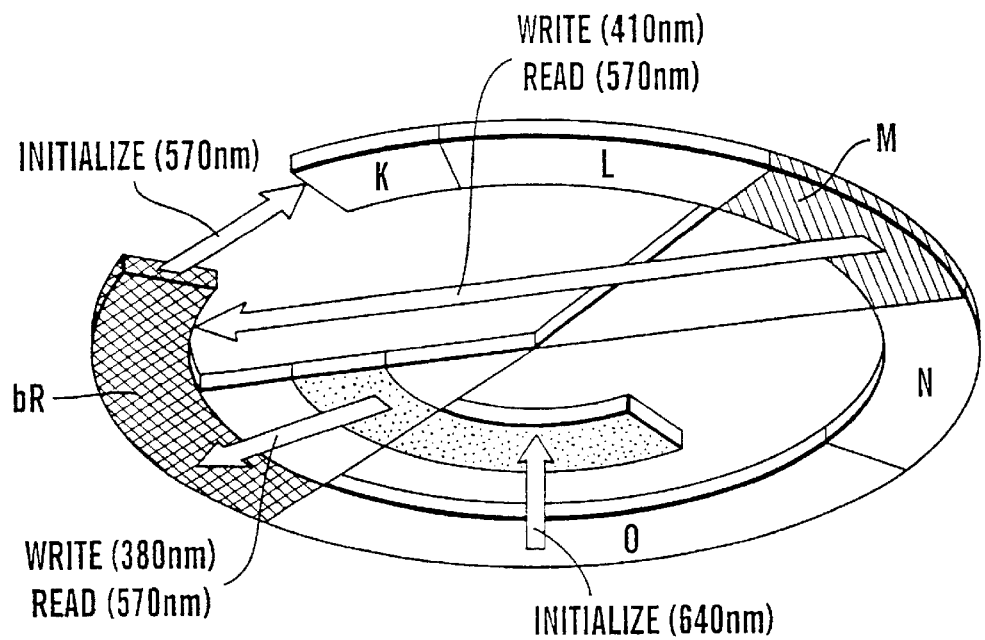

For further visualization of the bacteriorhodopsin's photocycle, it is illustrated graphically in FIG. 5c. The outer circle represents the progress of the photocycle in a clockwise direction, from the ground state bR and subsequently via the intermediate states K, L, M, N and O back to the ground state bR. The photocycle's branch reaction is represented by an inner circular arc with the P and Q states which are reached from the O state. Metastable states with a relatively long lifetime, i.e. M, P and Q are shown hatched. A circle sector represents the area of the photocycle which includes the states Q and bR which for the purposes of the invention should be considered as stable. Photo-induced transitions in the photocycle which are of importance for the present invention are indicated by numbered arrows. In the diagram, moreover, very transitory intermediate states which are of no significance for the invention are omitted. The same applies to those cases where an intermediate state is actually composed of several states with approximately identical absorption spectra.

Figure 5D:
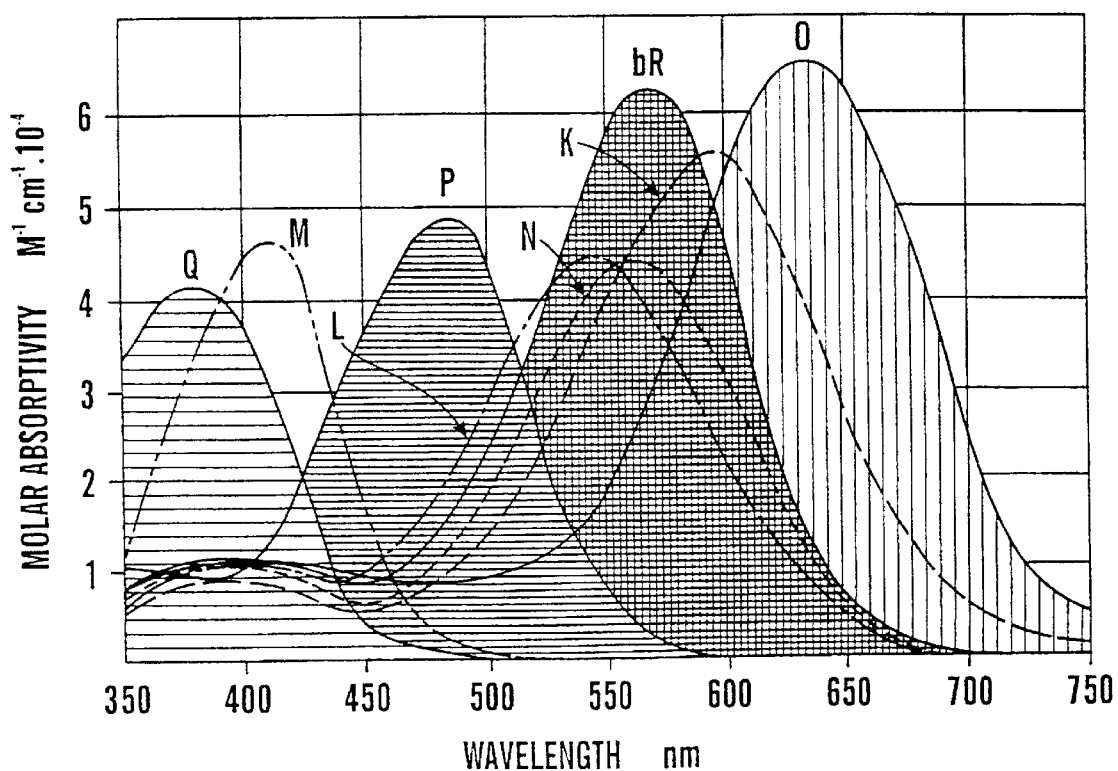

The absorption spectra of the different species or states of the bacteriorhodopsin are illustrated in FIG. 5d which also gives an indication of suitable effective bandwidths for illumination of a species in order to effect an excitation into another state. It will be seen, e.g., that use of an effective bandwidth centred round circa 600 nm will affect the states N, bR, K and O, but the consequence of such illumination will be that at least a significant proportion of the molecule population will be forced from bR over to the relatively stable Q state. It will naturally be possible to achieve the same result by illuminating the ground state bR continuously with a light pulse centred on 570 nm, thus causing the bR state to pass to the O state, while simultaneously also protractedly illuminating the bacteriorhodopsin with light centred on 640 nm, possibly after an interval of a few milliseconds, thus causing the O state to pass to the P state. The implications of this will be discussed in more detail in the following section. It will also be seen from FIG. 1d that it will be possible to effectively excite the Q state into the ground state bR by illuminating the molecules in the Q state with light at 380 nm or for example an effective bandwidth of 360–400 nm.

The memory substance 1 may also be a fluorescent, i.e. when it is excited by the activator 2, the memory substance 1 emits fluorescent light which is detected by the detector 3. In other words the detection takes place in emission. The use of fluorescent substances for storing data is well known to those skilled in the art, in addition to being demonstrated in the patent literature, and therefore any further description here will be superfluous.

Various preferred embodiments of the optical logic element according to the invention will now be discussed in more detail.

FIG. 6 illustrates the optical logic element OLE provided with electrodes 4, 4' or electrical conductors 5, 5' for electrical accessing and addressing of the activator 2 and the optical detector 3 respectively. For this purpose the electrodes 4, 4' or the electrical conductors 5, 5' are provided integrated in the second and the third layer $l_2$; $l_3$ respectively. Both electrodes 4, 4' and electrical conductors 5, 5' may preferably be based on an electrically conducting polymer material. If the electrical conductors 5, 5' are arranged in a mutually orthogonal configuration on each side of the layers $l_1$, $l_3$ respectively, it will be possible for the electrodes 4, 4' to be realized as points of intersection between respective orthogonally arranged electrical conductors 5, 5'. Furthermore, adjacent to the first layer $l_1$ or integrated therein there can be provided a further layer $l_4$, as illustrated in FIG. 7, for generation of an electrical field. This can be achieved by having the layer $l_4$ made of ferroelectrical, optoelectrical or similar materials, the generated electrical field then being used to influence the optical memory substance's 1 response in the time domain, the frequency domain or the intensity domain. As an example of this, reference is made to the above-mentioned SE patent no. 501 106 where a photo-conducting layer with optoresistive properties is provided between the memory substance and the electrode matrix respectively on one side of the memory substance. This permits, for example, an electrical field to be selectively impressed on the optical logic element if the activator is a radiation-emitting means, by the simultaneous impressing of an electrical control voltage between the layer $l_4$ and an electrode 4.

The radiation-emitting means 2 may be a semiconductor laser, in the form, for example, of a diode laser in the layer $l_2$ between electrodes 4, 4'. A plurality of radiation-emitting means $2_1 \ldots ,2_n$ may be provided, as illustrated in FIG. 2, in which case they may be arranged to emit on different preselected frequencies, e.g. by providing diode lasers with specific emission characteristics.

The radiation-emitting means 2 may also be an indirectly radiation-emitting means, in which case it must be capable of activation by an external radiation source 2' which is not shown in more detail. An external radiation source of this kind must be provided outside the optical logic element OLE, and if the optical logic elements are combined to form a two-dimensional matrix constituting an optical logic device OLD, this can be implemented by providing the radiation source on the edge of the matrix and outside it, in which case the layer $l_1$ must be able to act as a waveguide which transports light through the transparent base material in the layer $l_1$ to the indirect radiation-emitting means. Such a layer-shaped optical waveguide $l_2$ can be realized in analogy with microstrip lines or fibre optic waveguides and will therefore not be further discussed here.

The desire to provide a proximity-addressable logic device based on proximity-addressable logic elements, however, makes it generally preferable to employ direct radiation-emitting means 2 provided in the layer $l_2$.

In this case the radiation-emitting means 2 may be a light-emitting diode and specially preferred for this purpose are organic light-emitting diodes based on conjugated polymers. Such light-emitting polymer diodes are described in internationally published patent application no. WO95/3 1515 entitled "Colour source and method for its fabrication", in which the present applicant has acquired rights and which hereby is incorporated as reference. Light-emitting polymer diodes of this kind can emit light on several wavelengths by varying the working voltage of the diode. The diodes can emit light on different wavelengths, for example mainly red at a low working voltage and blue at a higher working voltage, while at intermediate voltages an emission stop can be obtained in both red and blue at varying intensities. The diodes may be manufactured as a thin polymer film with domains of conjugated polymers and in a thickness of a few tens of nanometers, the size of the individual diodes being not much larger. Integrated as the radiation-emitting means in an optical logic element, therefore, they will be compatible with optical logic elements OLEs of a similar size.

FIG. 8 illustrates the optical logic element according to the invention realized as a proximity-addressable optical logic element. The memory substance 1 which in this case may, for example, be a confirmation-reactive, light-sensitive material such as bacteriorhodopsin forms the layer $l_1$.

Adjacent to the light-sensitive material 1 or the structure $l_1$, emitters or light sources 2 are provided in the layer $l_2$, preferably in the form of light-emitting polymer diodes. The light-emitting polymer diode 2 is supplied with working voltage $V_E$ via two electrodes 4, 4' which are connected to a power source 6. The light-emitting polymer diode 2 is provided adjacent to the light-sensitive material 1, i.e. bacteriorhodopsin which has to be driven through a photocycle. This means that the electrode 4' must be transparent. Moreover, the light-emitting diode 2 for driving the bacteriorhodopsin 1 through the photocycle must provide a wavelength-tunable emission, which implies that in this case it will be relevant to design the light-emitting diode in the form of voltage-tunable polymer diodes of the type which, e.g., are described in the above-mentioned international patent application WO95/3 1515, in connection with which it is discussed in more detail. Opposite to the light-emitting polymer diode 2 and similarly adjacent to the bacteriorhodopsin layer $l_1$, there is provided a photovoltaic or photoconductive detector 3, also in the form of a layer $l_3$, which is similarly supplied with electrodes 4, 4' which transport the signal voltage $V_D$ emitted from the detector on detection of light to an operational amplifier 7. Obviously, in this case too the detector electrode 4 which faces the bacteriorhodopsin layer $l_1$ must be transparent.

Figure 9A:
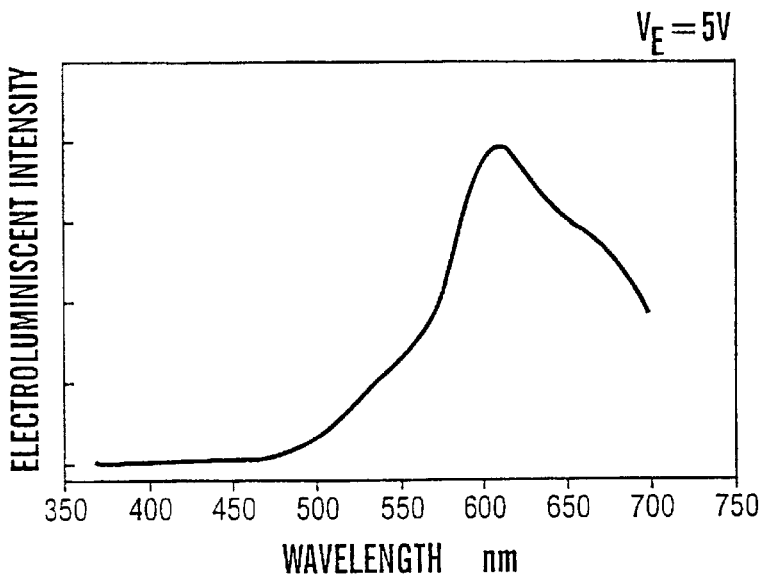
Figure 9B:
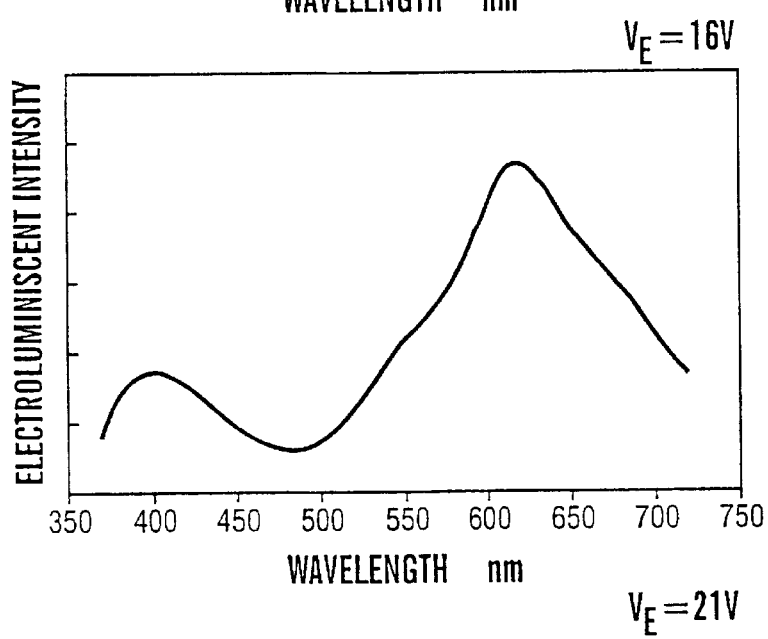
Figure 9C:
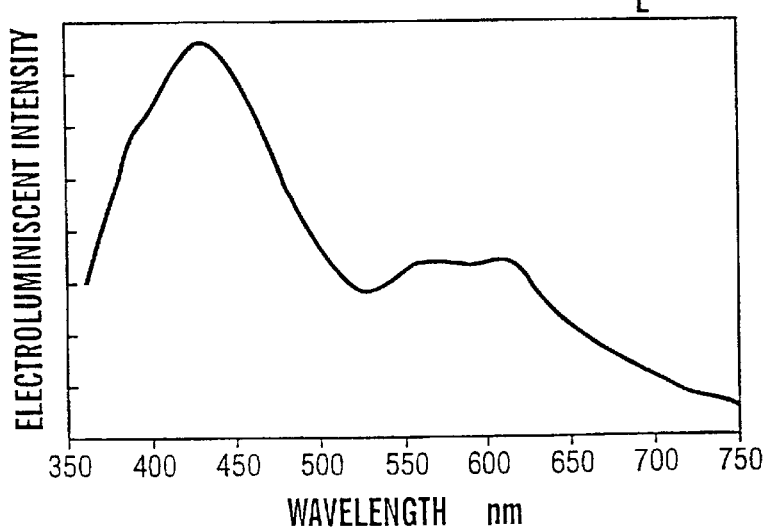

As mentioned, the voltage-tunable coloured light sources in the form of light-emitting polymer diodes have already been discussed with reference to the above-mentioned international patent application WO95/3 1515 and in addition are also more closely described by M. Bergren & al, Nature 372, pp. 444–446 (1994). By varying the working voltage $V_E$ impressed via the electrodes, such light-emitting polymer diodes will emit light on different wavelengths. The drafts illustrated of light-emitting polymer diodes of this kind are relatively general, and the spectral characteristic of the emitted light beam can be controlled within wide limits by means of an appropriate choice of light-emitting materials. With regard to the present description, where a spectral adaptation to the bacteriorhodopsin's light-absorbing properties in the different states is required, it should be assumed that the light-emitting polymer diode emits yellow light at low voltage $V_E$ and with an increasing emission of blue light as the voltage increases This is illustrated in more detail in FIGS. 9a–c, where FIG. 9a illustrates the spectral characteristic and the intensity for an impressed voltage $V_E$ of 5 volts. The emission occurs substantially in the form of red light with a spectral top of circa 630 nm. In this case the utility factor is 100%. In FIG. 9b the voltage is increased to 16 volts and the utility factor is reduced to 50%. It will be seen that the light-emitting polymer diode still maintains the emission top of circa 630 nm, but at the same time has an increasing emission of blue light of circa 400 nm. With an impressed voltage of 21 volts with a utility factor of 20% the emission on wavelengths over circa 530 nm is relatively reduced, and an emission peak is substantially obtained of blue light of high intensity and centred at circa 430 nm, as illustrated in FIG. 9c. The voltage-controlled emitter, i.e. the light-emitting polymer diode as described in the above-mentioned international patent application WO95/3 11515, contains a number of physically separated light-emitting domains 9, 9', as illustrated both in FIG. 8 and FIG. 10, which may be regarded as a schematic section through the emitter layer $l_2$. The domains 9, 9' are embedded in a transparent base material 8 which may, for example, itself be polymer, and each domain 9, 9' contains only one type of light-emitting polymer, i.e. either with a narrow bandgap which emits principally in yellow or red (for example 9) or with a wide bandgap which emits in blue (for example 9'). If the domains 9, 9' were large and located at a relatively great distance apart, this could cause problems due to unpredictable and uneven light emission from the light-emitting diode and in the case of certain optical radiation geometries give a poor spatial overlapping between red and blue light which strike a given central point in the bacteriorhodopsin structure. Experimental tests, cf. above-mentioned WO95/3 1515, have shown that for the moment at least it is possible to attain typical dimensions and distances between the domains in a range from a few 10 nm up to a few 100 nm, with the result that the scale factor for the thickness of the polymer layer or the base material 8 corresponds to the domain cross section, since the domains have to contact the electrodes 4, 4' on surfaces of the base material. Effects which are due to spatially discretised light emission will therefore only be noticeable with very small light-emitting polymer diodes, typically on a scale of a few nanometres. On the other hand, there are also indications that the size of the light-emitting, polymer diodes 2 can be considerably reduced by decreasing the size of the domains 9, 9', thus avoiding any unfavourable spatial effects even with light-emitting diodes of circa 10 nm or thereabouts in size. The thickness of the emitter layer $l_2$ will then be comparable, with the result that at least in theory it will be possible to realize optical logic elements according to the present invention in a size of at most a few nm and a corresponding thickness.

The photovoltaic or photoconductive detector 3 is similar in design to the emitter 2 or the coloured light source, viz. with the use of similar polymer diodes to those shown in FIG. 8 and with the domains now light-absorbing, with the result that, depending on the spectrum, a detected variation in the light intensity will generate the signal voltage or the detector's output voltage $V_D$ on the electrodes 4, 4'. In the same way the detector 3 in this case must be tuned to the emitter's 2 spectral properties. For the detector 3 too the same scale factors apply as for the light-emitting polymer diode 2, the dimensions of the domains 9, 9' determining the layer thickness. Obviously, the layer thickness must be compatible with the domain cross section, thus enabling contact to be made with the electrodes 5, 5'.

It will be seen that the optical logic element OLE which is described with reference to use of a light-sensitive organic substance, viz. bacteriorhodopsin and light-emitting polymer diodes, is designed to be proximity-addressable, thus avoiding the restrictions on the scale factors which would exist if the light were passed to the light-sensitive organic substance through optically active structures in the form of refractive or diffractive elements provided outside the bacteriorhodopsin structure and between it and the emitter. In that case the size of the optical logic element will be limited by the wavelength of the light radiation employed.

An optical logic device OLD according to the invention will now be discussed with reference to FIGS. 11–17.

Figure 11:
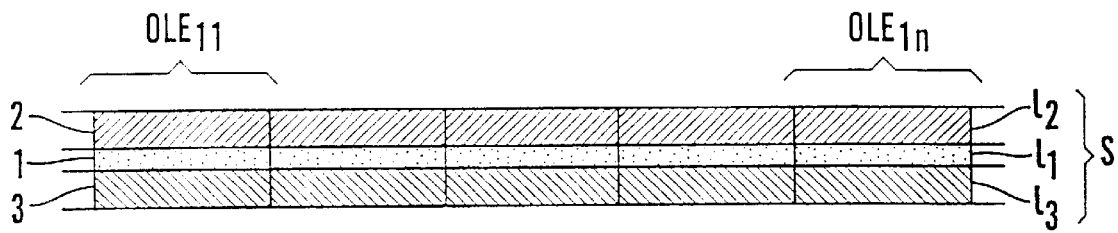
FIG. 11 shows a first design of an optical logic device according to the invention.
Figure 12:
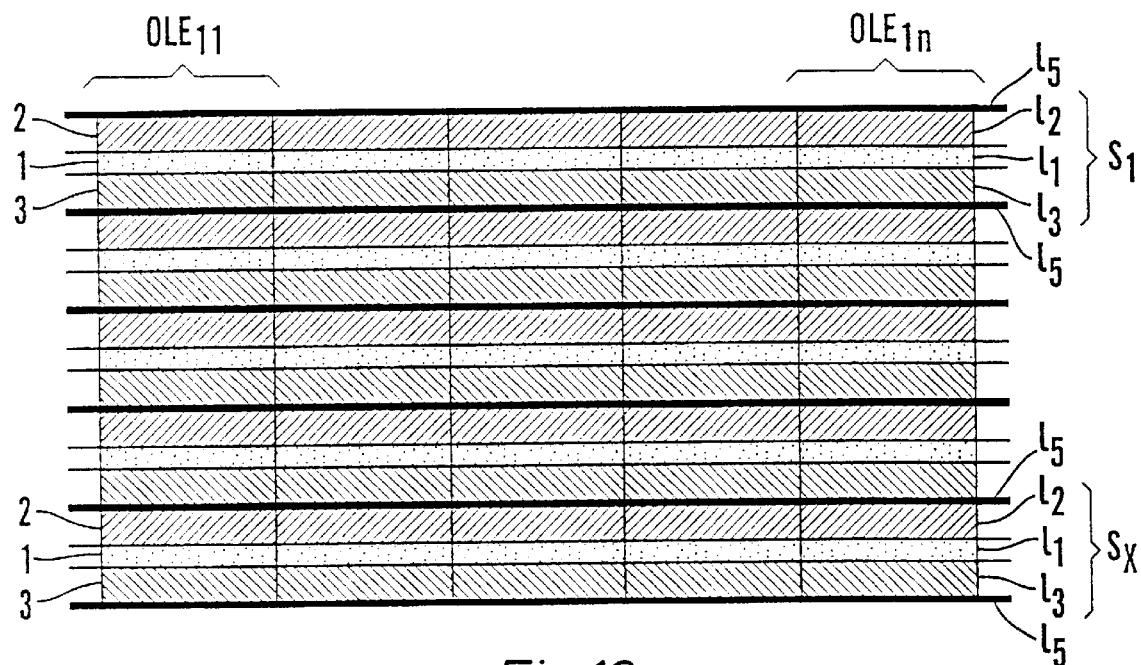
FIG. 12 shows a second design of an optical logic device according to the invention.

FIG. 11 shows a design where the optical logic device is in the form of a two-dimensional array or structure S of optical logic elements OLEs and illustrates a section through a row of such optical logic elements, exemplified here by the optical logic elements $OLE_{11}$ and $OLE_{1n}$ in m·n array and with m=n=5 in this case. FIG. 12 shows an optical logic device according to the invention, where two-dimensional arrays or structures $S_1, \ldots, S_x$ of optical logic elements OLEs are stacked in layers, the two-dimensional array of optical logic elements thus forming a surface body structure S in a volumetric optical logic device OLD. The optical logic device OLD is thereby realized as a three-dimensional array, for example with m·n·x logic elements, x being the number of stacked structures S. In FIG. 12 which schematically illustrates a section through connected stacked rows of arrays which form the structures S, for example the row m=1 in the m·n array, two optical logic elements OLEs in the structure $S_1$ are designated $OLE_{11}$ and $OLE_{1n}$ respectively. As illustrated in FIG. 12, the optical logic device OLD comprises five such structures S, so that x=5, and FIG. 12 can thereby be considered to illustrate a volumetric optical logic device with 5·5·5 =125 optical logic elements OLEs. Between each of the structures there is provided an optically, thermally and/or electrically insulating layer $l_5$.

Figure 13:
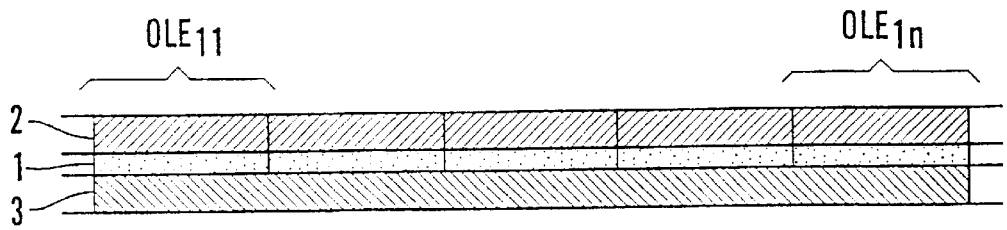
FIG. 13, shows a variant of the optical logic device in FIG. 11.

In a variant of the optical logic device OLD, groups of optical logic elements OLEs, for example in the form of rows, columns or sub-arrays of the m·n arrays, may be assigned to a common optical detector 3 which covers all the logic elements in the group, as illustrated in FIG. 13.

Figure 14:
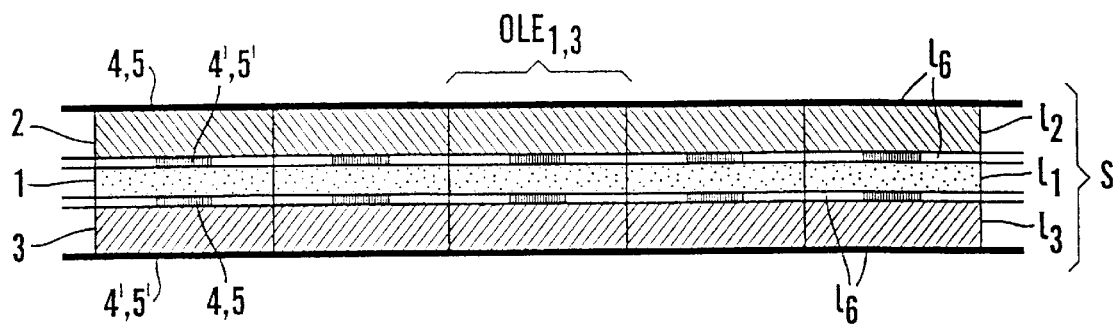
FIG. 14 shows a second variant of the optical logic device in FIG. 11.

As illustrated in FIG. 14, each structure S may comprise one or more layers $l_6$ which integrally comprise electrodes 4, 4' and electrical conductors 5, 5' assigned to the optical logic elements OLEs which form part of the structure S and which are used for accessing and addressing the optical logic device OLD. As illustrated in FIG. 14, the conductors 5, 5' may be provided orthogonally to each other, in which case it will be possible to realize the electrodes 4, 4' at the point of intersection between the conductors 5, 5' in each optical logic element OLE, forming, for example, a diode structure in the layers $l_2$ and $l_3$ between the points of intersection of the conductors 5, 5'.

Figure 15:
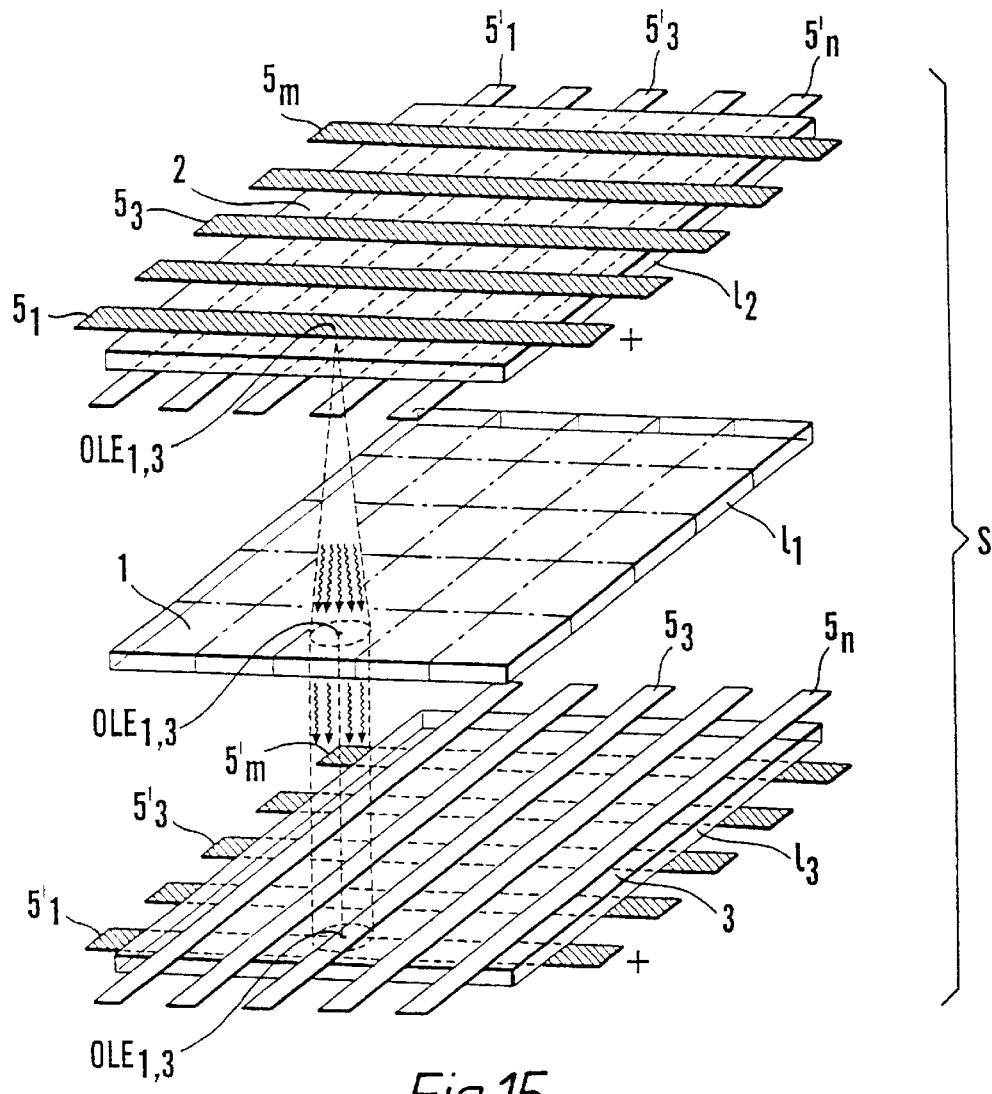
FIG. 15 shows a schematic and exploded illustration of the design of the optical logic device in FIG. 14.

The arrangement of proximity-addressable optical logic elements OLE in an array is shown in perspective in FIG. 15, where the individual layers of the array, viz. the activator layer $l_2$, the memory substance layer $l_2$ and the detector layer $l_3$ which form the optical logic elements OLEs, are illustrated in exploded form. The array consists of m·n logic elements OLEs and is in FIG. 15 illustrated in reality as a 5·5 array. On the activator layer $l_2$ there are provided conductors 5, 5', cf. FIG. 14, with an electrode 4, 4' placed in each of the points of intersection between the conductors 5, 5', these impressing a voltage. If the activator 2 is a light-emitting diode, it will now emit light which influences a memory substance in the form of light-sensitive organic substance, such as acteriorhodopsin in the layer $l_1$. The detection takes place in the detector layer $l_3$, where, in this case on illumination at each intersection point between the provided conductors 5, 5', a light-absorbing detector diode 3 is similarly obtained. The optical logic element thereby formed is illustrated as $OLE_{13}$, and in this case for the sake of simplicity each of the layers $l_1$, $l_2$, $l_3$ or the matrices are illustrated as a 5·5 matrix.

Figure 16:
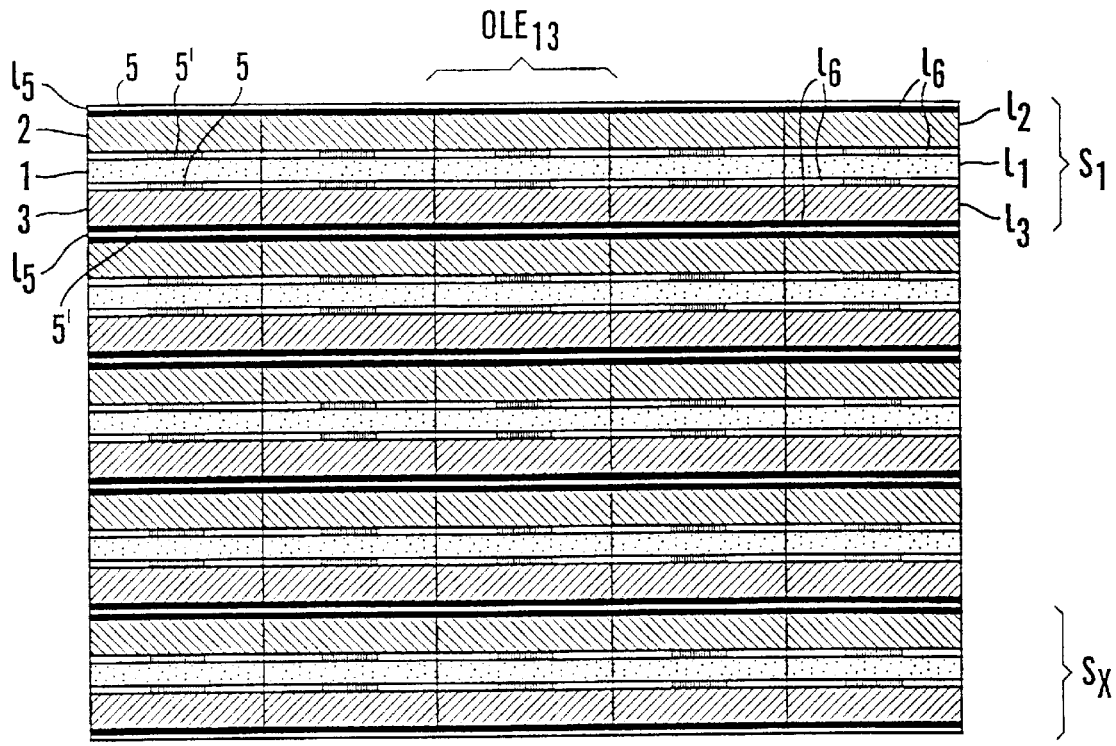
FIG. 16 shows a further design of the optical logic device according to the invention, based on the variant in FIG. 14.

The optical logic device which is illustrated in FIG. 15 can now be used to form a volumetric optical logic device, consisting of structures S in the form of a number of layers or matrices, $S_1, \ldots, S_x$. Such an optical logic device OLD is illustrated in FIG. 16, and in each individual layer S there is provided an activator layer $l_2$, a memory substance layer $l_1$ and a detector layer $l_3$. As in FIG. 15 there are provided conductors 5, 5', illustrated here integrated in layer $l_6$, and in the optical logic element OLE electrodes will be formed between the points of intersection of the conductors 5, 5'. Between each of the structures S and possibly also on the top and bottom of the device OLD there may be provided an optically, thermally and/or electrically insulating layer $l_5$. For the sake of simplicity the device as illustrated in FIG. 16 is shown in the form of a cube with 5·5·5 optical logic elements, i.e. 125 in all. The size of an optical logic element $OLE_{13}$ within the structure $S_1$ is illustrated and may correspond to the optical logic element $OLE_{13}$ as illustrated in FIG. 15.

Since each of the optical logic elements OLEs is proximity-addressed, i.e. both emitter and detector are arranged adjacent to the light-sensitive organic substance and are located inside the device, the number of elements an m·n array may include and the number of structures S which may be stacked on top of one another are merely practical matters.

In an optical logic device OLD based on the use of proximity-addressable optical logic elements OLEs according to the present invention as illustrated in FIGS. 11–12, the only restriction in the scale factor at least in theory is the molecular dimensions of the memory substance 1, if a light-sensitive conformation-reactive material is employed, together with the realizable least size of the assigned activator 2 and detector 3. In practice, tests indicate that when using light-emitting polymer diodes, optical logic elements can be realized at present in a size of a few tens of nanometres, and correspondingly small conductor structures for the electrodes for emitters and detectors, with the result that the realistic area of the optical logic element may constitute between 2500 $nm^2$ and 10 000 $nm^{2.}$ In the worst case this amounts to $10^{10}$ optical logic elements per $cm^2$ and realized volumetrically with a corresponding layer thickness, it will be possible to achieve in the optical logic device according to the invention $10^{15}$ proximity-addressable optical logic elements in 1 $cm^3$. It is considered to be possible to achieve a linear scale improvement of one order of magnitude, thus permitting $10^{18}$ optical logic elements to be realized according to the present invention in 1 $cm^3$. In order to give an indication of the storage capacity of such an optical logic device realized as an optical memory, it should be mentioned that this corresponds to storing $10^{14}$ ordinary book pages, which might be sufficient for most types of archival storage.

Figure 17:
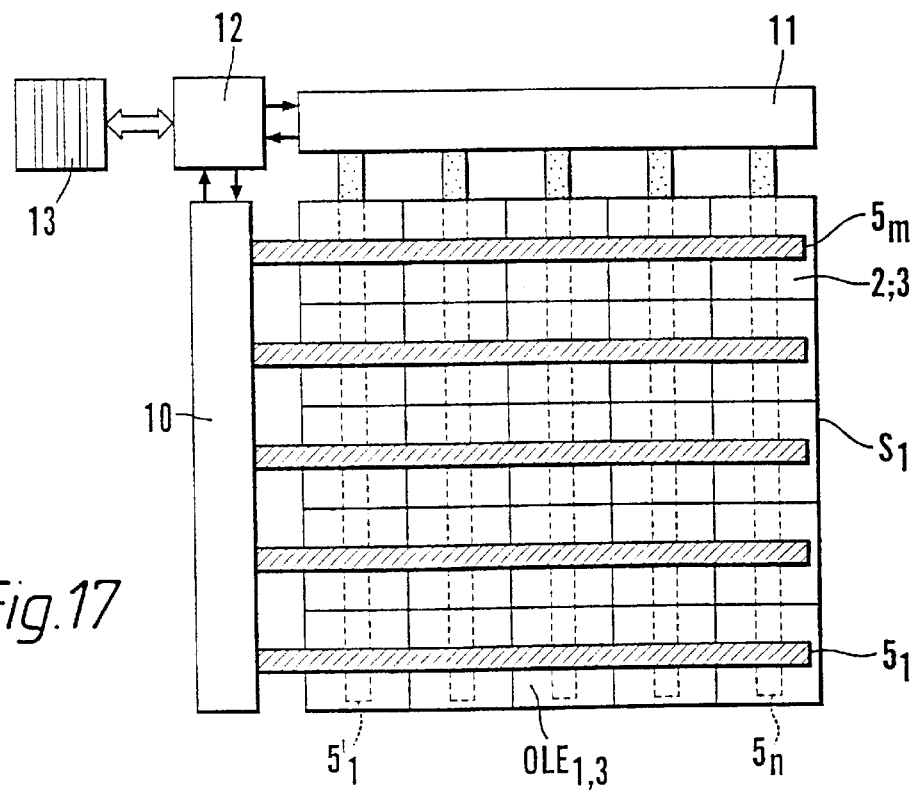
FIG. 17 shows a schematic illustration of an arrangement for addressing the optical logic device according to the invention.

FIG. 17 illustrates schematically an arrangement for addressing a single structure $S_1$ in the optical logic device OLD according to the invention. For the sake of simplicity FIG. 17 illustrates the structure $S_1$ in the form of a 5·5 array, i.e. with 25 logic elements. For each row or column in the array there are provided electrical conductors 5, 5' in an orthogonal configuration, thus enabling the optical logic element to be accessed and addressed at the points of intersection between the conductors 5, 5'. With this arrangement it will also be possible to address and activate all the optical logic elements OLEs. The conductors 5, 5' are connected to respective driver circuits 10, 11 which are connected via an interface 12 with a main bus 13 which is illustrated in section in FIG. 17 and extends vertically to the plane of the figure, in such a manner that it is connected to all the structures S which form part of the optical logic device OLD. It may be expedient for the addressing to be performed in a hierarchical arrangement which can unambiguously address the optical logic device OLD for example on the structural level, or functionally co-operating groups of optical logic elements OLEs in each structure S or a single optical logic element OLE in the structure S. Those skilled in the art will realize that there are a number of possibilities for realizing accessing and addressing of a volumetric, optical logic device in proximity, and that it will also be possible to implement parallel accessing and addressing by employing multiplexed communication lines. The accessing and addressing arrangement, however, does not form any part of the present invention and will therefore not be discussed in more detail here.

The optical logic device OLD according to the invention is not only suited to storage of data, but may also be realized as a device for processing of data. In this case processing of data should be understood to mean that the optical logic elements are combined in optical logic networks in order to perform logic operations and by means of optical logic gates and optical logic gate circuits which realize these functions, or in arithmetic circuits in order to perform binary arithmetic operations realized by means of arithmetic registers based on binary logic. It will thus be possible to configure groups of logic elements OLEs in a structure S as memory registers, logic registers and arithmetic registers, since each logic element OLE in a register and each register can be accessed and addressed individually. The registers may be configured jointly to form an optical data processor. This optical data technology is analogue to conventional data technology based on semiconductor components and familiar to those skilled in the art. In this connection reference may be made, for example, to Alastair D. McAulay, "Optical Computer Architectures. The Application of Optical Concepts to Next Generation Computers", John Wiley & Sons (1991), especially "Part II: Subsystems for Optical Computing", pp 127–342.

Figure 18:
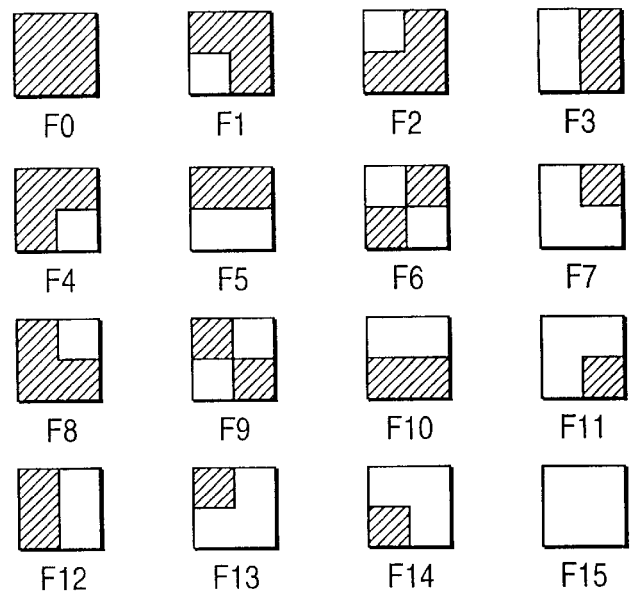
FIG. 18 shows the sixteen Boolean functions of two binary variables generated by an optical logic device according to the invention.

The optical logic elements OLEs according to the invention may be combined in an optical logic device OLD which is to be used for data processing to form logic circuits which, for example, may perform all possible sixteen Boolean logic functions of two binary variables, whether as memory substance there is employed an electron trapping material or a light-sensitive confirmation-reactive material such as bacteriorhodopsin. A combination of four optical logic elements OLEs which realize these sixteen Boolean functions is illustrated in FIG. 18, formed as a 2·2 array with logic 0 hatched and logic 1 unhatched. These sixteen Boolean functions of two binary variables are illustrated in table I, while table II shows how Boolean functions are generated by combination of logic operations.

TABLE I

Sixteen Boolean functions of two binary variables

| Input | | Output | | | | | | | | | | | | | | | |
|---|---|---|---|---|---|---|---|---|---|---|---|---|---|---|---|---|---|
| A | B | F0 | F1 | F2 | F3 | F4 | F5 | F6 | F7 | F8 | F9 | F10 | F11 | F12 | F13 | F14 | F15 |
| 0 | 0 | 0 | 0 | 0 | 0 | 0 | 0 | 0 | 0 | 1 | 1 | 1 | 1 | 1 | 1 | I | 1 |
| 0 | 1 | 0 | 0 | 0 | 0 | 1 | 1 | 1 | 1 | 0 | 0 | 0 | 0 | 1 | 1 | 1 | 1 |
| 1 | 0 | 0 | 0 | 1 | 1 | 0 | 0 | 1 | 1 | 0 | 0 | 1 | 1 | 0 | 0 | 1 | 1 |
| 1 | 1 | 0 | 1 | 0 | 1 | 0 | 1 | 0 | 1 | 0 | 1 | 0 | 1 | 0 | 1 | 0 | 1 |
| Function Name | | 0 | AND | $A\overline{B}$ | A | $\overline{A}B$ | B | XOR OR | | NOR | XNOR | $\overline{B}$ | $A + \overline{B}$ | $\overline{A}$ | $\overline{A} + B$ | NAND | 1 |

TABLE II

Generation of Boolean functions by combination of logic operations

| Boolean Function | Boolean Function |
|---|---|
| F0 = 0, | F1 = A · B, |
| F2 = A · $\overline{B}$, | F3 = A, |
| F4 = $\overline{A}$ · B, | F5 = B, |
| F6 = A · $\overline{B}$ + $\overline{A}$ · B, | F7 = A + B, |
| F8 = $\overline{A}$ · B, | F9 = A · B + $\overline{A}$ · $\overline{B}$, |
| F10 = $\overline{B}$, | F11 = A + $\overline{B}$, |
| F12 = $\overline{A}$, | F13 = $\overline{A}$ + B, |
| F14 = $\overline{A}$ + $\overline{B}$, | F15 = 1, |

With reference to table III it will now be shown how some Boolean logic functions of two binary variables are realized by means of optical logic elements OLEs where the memory substance 1 is an electron trapping material. In this case the electron trapping material is brought to a common state by means of illumination with blue light. Subsequent illumination with red light releases the trapped electrons and orange light is emitted. In this case the activator 2 will be designed as two separate addressable radiation-emitting means, for example in the form of a voltage-tunable, light-emitting diode. A bandpass filter may now be used which may be in the form of a layer between the memory substance 1, i.e. the electron trapping material, and the detector 3, thus blocking blue and red light. Only the stimulated orange fluorescent light is thereby detected.

TABLE III

Generation of Boolean functions in an electron-trapping material

| Function: | Operation |
|---|---|
| AND: | Input A: Blue light for variable value 1 (no light = 0)<br>Input B: Red light for variable value 1 (no light = 0).<br>Result: if both A and B were activated and blue and red light were flashed, an orange output flash results, giving a detector signal, i.e.: A B = 1 |
| OR: | Input A: Blue and red light for variable value 1 (no light = 0)<br>Input B: Blue and red light for variable value 1 (no light = 0)<br>Result: if either A, B or both were flashed in Step 1, an orange flash results, giving a detector signal, i.e. A + B = 1 |
| ZERO: | No illumination<br>Result: No orange flash; no detector signal, i.e.: 0 (zero) |
| IDENTITY: | Input independent: Illumination blue, then red.<br>Result: Orange flash, and detector signal, i.e. 1 (one) |
| NOT: | E.g.: $\overline{A}$ B:<br>Input independent preparative step: Illumination blue<br>Input A: Red light (empty the traps) for variable value 1 (no light = 0)<br>Input B: Red light for variable value 1 (no light = 0)<br>Result: An orange flash and thus a detector signal, i.e. $\overline{A}$ B = 1 is only obtained if A = 0 and B = 1.<br>E.g.: A · $\overline{B}$: Change roles of A, B in the above |

If bacteriorhodopsin is employed as memory substance, in this case the memory substance will manifest its different logic states by changes in the optical transmissivity, the detection thus being performed in absorption mode and not in emission mode as is the case with fluorescence. An example of the realization of some Boolean logic functions of two variables is illustrated in table IV, where it is assumed that a photocycle for bacteriorhodopsin is employed where the molecules are switched between the ground state bR and the metastable M state. Illumination of the bR state with yellow light produces a transition to the M state which absorbs blue light, while an illumination with blue light in the M state returns the bacteriorhodopsin molecules to the ground state bR. The molecule state can be monitored by measuring the absorption of blue light by means of a weak blue probe beam. In the arrangement illustrated in table 4, where blue light is employed both for the preprocessing stage and the input signal as well as for the output signal, it will be necessary to perform discrimination by time sequencing. The photocycle which involves the M state is partially thermally driven with time constants $\tau_v$ which may constitute several milliseconds. In order to achieve high total processing rates it is necessary for the optical logic elements OLEs in the optical logic device OLD or groups of such optical logic elements OLEs to be addressed in parallel. The use of bacteriorhodopsin as memory substance 1, however, offers several opportunities for realizing logic circuits based on the use of the optical logic element OLE according to the present invention. It may be mentioned that both the processing of the bR state by means of yellow light and the processing of the M state by means of blue light are photochemical reactions, i.e. they are driven by photons, and that in each case the switching rate is principally dependent on the intensity of the light radiation employed. It is also possible to employ switching between, e.g. the ground state bR and the K state, a transition which occurs very rapidly ($\tau_v \sim 10$ ps). After absorption of blue light in the bR state the molecule is driven over to the K state via an intermediate state J in the course of a few picoseconds. The K state absorbs on a wavelength which is shifted compared with the absorption wavelength of the bR state, viz. on a wavelength of 590 nm, and may return to the bR state by means of a very rapid photo-induced process of at most a few nanoseconds' duration. When using bacteriorhodopsin as memory substance it may also be attractive to use the long-term stable Q state which forms part of the above-mentioned branch reaction of the bacteriorhodopsin's photocycle. Use of the ground state bR and the Q state respectively will give a high spectral insulation between input light (write light) and probe light (read light) as well as a simple and direct implementation of logic circuits which realize Boolean functions. One possible drawback is the relatively low cycle speed between the states, but by again realizing the optical logic device according to the invention with the possibility of addressing in massive parallelism, it will be possible to attain very high data rates.

TABLE IV

Generation of Boolean functions in bacteriorhodopsin

| Function | Operation |
|---|---|
| AND: | Input independent preparatory step: Yellow light to rate M state.<br>Input A: Strong blue light to bleach molecules (M→bR state) for variable value 1 (no light = 0).<br>Input B: Sequential to Input A: Weak blue light for variable value 1 (no light = 0)<br>Result (measure strength of weak probe light during Step B):<br>If A = 1 and B = 1, transmitted blue probe light is strong, i.e. A B = 1,<br>If A = 0 or B = 0 or A, B = 0, transmitted blue light is weak or zero, i.e. A B = 0 |
| OR: | Input A: Weak blue light for variable value 1 (no light = 0)<br>Input B: Weak blue light for variable value 1 (no light = 0)<br>Result: Measure strength of transmitted weak blue probe light in Step B. If Steps A, B are applied sequentially, use integrating photon detector. If A = 1, B = 1 or A, B = 1, transmitted blue probe light signal detected, i.e.:<br>A + B = 1<br>If A = B = 0, no signal, i.e. A + B = 0 |
| NOT: | E.G.: $\overline{A}$ B:<br>Input A: Strong blue light for variable value 1 (no light = 0)<br>Input B: Weak blue light for variable value 1 (no light = 0)<br>Result: Measure strength of transmitted blue probe light in step B.<br>Transmittance is low or zero unless A = 0, i.e.:<br>If A = 0 and B = 1, $\overline{A}$ B = 1<br>If A = 1 and B = 0 or A = 1 and B = 1, $\overline{A}$ B = 0 |

Figure 19:
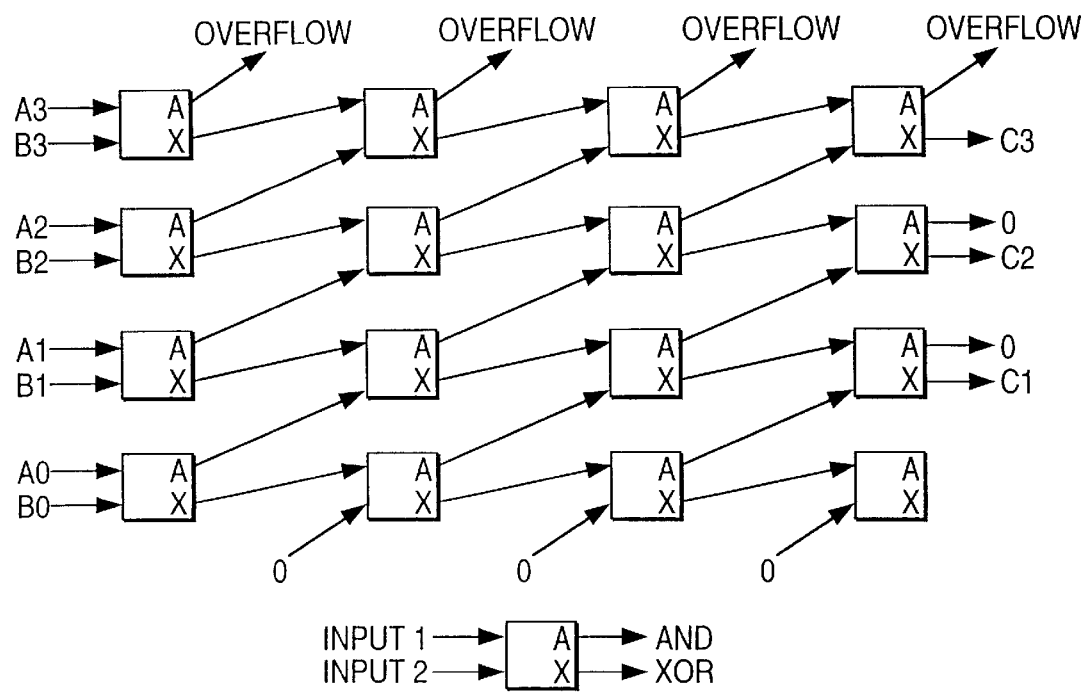
FIG. 19 shows a schematic illustration of a parallel algorithm for four-bit binary full addition for implementation on the optical logic device according to the invention.

If the optical logic device according to the invention is to be realized as an optical data processor, this implies that it must be possible to realize arithmetic registers which perform binary arithmetic operations. An example of a parallel algorithm for four-bit full addition is illustrated in FIG. 19 and will be able to be implemented by logic gates with memory substance based on, for example, an electron trapping material or bacteriorhodopsin, cf. FIG. 18. A binary half-adder quite simply consists of an EXCLUSIVE-OR gate for the sum and an AND gate for carry. In order to realize a full addition the carry from the half-addition of the less significant bit must be taken into consideration. Logic gates with three inputs are therefore required. This would exclude the use of optical logic elements OLEs according to the present invention, since they only have two inputs for a logic operation. In order to overcome this problem an iterative parallel-flow algorithm may be employed, and an example of a four-bit addition which only requires four iterations is thus presented in FIG. 19. The advantage of this algorithm is that a series of shift-and-logic operations can be performed repeatedly by means of the same optical logic element with two inputs, i.e. in the case of electron trapping materials or bacteriorhodopsin with light on two wavelengths. Parallel logic operations EXCLUSIVE-OR and AND can be performed by an optical logic element. Alternatively, the shifted intermediate output signal may be fed back to the logic device via the detector and the addressing system in order to excite the optical logic element with light on the input wavelengths. It is assumed that at any rate a fully optical system can be realized on the basis of this principle by means of optical logic elements OLEs and with the memory substance either in the form of an electron trapping material or a conformation-reactive material which can undergo a photocycle such as bacteriorhodopsin, if the activator is a light-emitting, wavelength-tunable polymer diode, as described above.

The above-mentioned examples of realization of Boolean logic functions and an arithmetic operation are naturally intended as examples, and it will be understood by those skilled in the art that it not only will be possible to realize such operations within the scope of the present invention, but all logic and arithmetic operations in binary logic in general, and with the optical logic device according to the invention configured in an architecture which implements an optical data processor with substantial capacity and speed. Nor is there any reason why an optical logic device OLD according to the present invention should not be configured into a large computer with a number of processors which can be addressed and work in massive parallelism. If the processors are implemented as systolic array processors and if a dynamically optimizable network topology is employed, the use of proximity-addressable optical logic elements according to the present invention will offer a performance and capacity which are several orders of magnitude above conventional semiconductor-based technology, and additionally entail advantages which only optically-based data technology seems to be capable of realizing.

We claim:

1. An optical logic element (OLE), particularly a multistate, multistable optical logic element, and even more particularly a proximity-addressable optical logic element, comprising:

an optical memory substance, wherein, under the influence of an impressed magnetic, electromagnetic or electrical field or supplied energy, the memory substance can transfer from one physical or chemical state to a second physical or chemical state, wherein a physical or chemical state is assigned specific logic value and wherein a change in the logic element's physical or chemical state causes a change in the logic value and is implemented by the logic element being accessed and addressed magnetically, electromagnetically, electrically or optically for writing, reading, storing, erasing and switching of an assigned logic value;

an activator which generates a magnetic, electromagnetic or electrical field or supplies energy to the memory substance; and an optical detector for detection of the memory substance's optical response conditional on the memory substance's physical or chemical state;

the optical logic element (OLE) including the memory substance, activator and optical detector constituting a unitary integrated component.

2. An optical logic element according to claim 1, wherein the optical detector is an electrically accessible and addressable optical detector.

3. An optical logic element (OLE), particularly a multistate, multistable optical logic element, and even more particularly a proximity-addressable optical logic element, comprising:

an optical memory substance, wherein, under the influence of an impressed magnetic, electromagnetic or electrical field or supplied energy, the memory substance can transfer from one physical or chemical state to a second physical or chemical state, wherein a physical or chemical state is assigned specific logic value and wherein a change in the logic element's physical or chemical state causes a change in the logic value and is implemented by the logic element being accessed and addressed magnetically, electromagnetically, electrically or optically for writing, reading, storing, erasing and switching of an assigned logic value;

an activator which generates a magnetic, electromagnetic or electrical field or supplies energy to the memory substance; and an optical detector for detection of the memory substance's optical response conditional on the memory substance's physical or chemical state;

the optical logic element (OLE) including the memory substance, activator and optical detector constituting an integrated component;

the memory substance being provided in the form of a first layer ($l_1$), the activator being provided in the form of a second layer ($l_2$) adjacent to the first layer ($l_1$) or provided integrated in the first layer ($l_1$), and the optical detector which detects the state of the memory substance being provided in the form of a third layer ($l_3$) adjacent to the first layer ($l_1$), the optical logic element (OLE) thus forming the integrated component, consisting essentially of at least three or two layers respectively ($l_1$, $l_2$, $l_3$, or $l_1$, $l_3$).

4. An optical logic element according to claim 3, wherein under the influence of the magnetic, electromagnetic or electrical field or the supplied energy the memory substance can pass from one state to a second and from the second state return to the first state.

5. An optical logic element according to claim 3, wherein under the influence of the magnetic, electromagnetic or electrical field or the supplied energy the memory substance can pass from one state to a second, permanently stable state.

6. An optical logic element according to claim 3, wherein the optical memory substance is an electron trapping material.

7. An optical logic element according to claim 3, wherein the optical memory substance is a fluorescent material.

8. An optical logic element according to claim 3, wherein the optical memory substance is a conformation-reactive material.

9. An optical logic element according to claim 2, wherein each layer ($l_1, l_2, l_2, l_3$) comprises a base material.

10. An optical logic element according to claim 9, wherein the base material is optically transparent.

11. An optical logic element according to claim 9, wherein the base material consists of one or more polymer materials.

12. An optical logic element according to claim 11, wherein more than one polymer material is used in the second ($l_2$) and third ($l_3$) layers.

13. An optical logic element according to claim 2, wherein at least one of the polymer materials in the second ($l_2$) and/or third ($l_3$) layers is an electrically conductive polymer material.

14. An optical logic element according to claim 9, wherein the memory substance is provided on or embedded in the base material in the first layer ($l_1$).

15. An optical logic element according to claim 9, wherein the activator is composed of one or more direct or indirect radiation-emitters ($2_1, \ldots, 2_n$), the radiation-emitters being provided on or embedded in the base material of the second layer ($l_2$).

16. An optical logic element according to claim 15, wherein the radiation-emitter is accessed and addressed electrically.

17. An optical logic element according to claim 16, wherein the radiation-emitter is a light-emitting diode.

18. An optical logic element according to claim 17, wherein the light-emitting diode is a polymer diode.

19. An optical logic element according to claim 16, wherein the radiation-emitter is a semiconductor laser.

20. An optical logic element according to claim 16, wherein the radiation-emitter is frequency-tunable, the frequency tuning being performed in connection with electrical addressing.

21. An optical logic element according to claim 15, wherein more than one radiation-emitter is provided, each of the radiation-emitters ($2_1, \ldots, 2_n$) respectively emitting on different, preselected frequencies.

22. An optical logic element according to claim 15, wherein the radiation-emitting means is an indirect radiation-emitter arranged to be activated by an external radiation source.

23. An optical logic element according to claim 16, wherein electrodes and electrical conductors integrated in the second ($l_2$) and third ($l_3$) layers are provided for electrical accessing and addressing.

24. An optical element according to claim 23, wherein electrodes and electrical conductors are based on a electrically conductive polymer material.

25. An optical logic element according to claim 3, wherein the optical memory substance is integrated with the activator into a common physical structure, with the result that the first ($l_1$) and second ($l_2$) layers are combined to form a common layer ($l_c$).

26. An optical logic element according to claim 25, wherein, on being supplied with energy, the activator is arranged to be destroyed whereupon it itself forms a memory substance in a permanently, stable state, or is integrated with the memory substance, leaving it in the same permanently, stable state.

27. An optical logic element according to claim 3, wherein the second layer ($l_2$) and the third layer ($l_3$) are provided on opposite sides of the first layer ($l_1$) and adjacent thereto.

28. An optical logic element according to claim 3, wherein adjacent to the first layer ($l_1$) or integrated therein, a further layer ($l_4$) is provided for generating an electrical field, the generated electrical field being used to influence the optical memory substance's response in the time domain, the frequency domain or the intensity domain respectively.

29. An optical logic element according to claim 28, wherein the further layer ($l_4$) comprises one or more electrically conductive polymer materials.

30. An optical logic device (OLD), especially for storing data or performing logic and arithmetic operations, comprising:
plural optical logic elements (OLEs), where the optical logic elements (OLES) are particularly multistate, multistable optical logic elements, and even more particularly proximity-addressable optical logic elements, each said optical logic element including,
an optical memory substance, wherein, under the influence of an impressed magnetic, electromagnetic or electrical field or supplied energy, the memory substance can transfer from one physical or chemical state to a second physical or chemical state, wherein a physical or chemical state is assigned a specific logic value and wherein a change in the logic element's physical or chemical state causes a change in the logic value and is implemented by the logic element being accessed and addressed magnetically, electromagnetically, electrically or optically for writing, reading, storing, erasing and switching of an assigned logic value, can activator which generates a magnetic, electromagnetic or electrical field or supplies energy to the memory substance, and an optical detector for detection of the memory substance's optical response conditional on the memory substance's physical or chemical state;
the optical logic element (OLE) including the memory substance, activator and optical detector constituting a unitary integrated component;
the optical logic device (OLD) being assembled from the plural optical logic elements to form at least one structure with the optical memory substance, the activator, and the detector of each optical logic element (OLE) being merged together and connected with the memory substance, the activator and the detector in the surrounding logic elements (OLEs) to form a flat or curved surface body,
each optical logic element (OLE) in the structure having an unambiguous assignment between the memory substance and the activator and an assignment between the memory substance and the optical detector for unambiguous detection of a physical or chemical state in the memory substance, thus enabling each optical logic element (OLE) in the structure to be accessed and addressed individually.

31. An optical logic device according to claim 30, wherein each structure is in the form of a thin flexible film.

32. An optical logic device according to claim 30, wherein the optical logic device (OLD) comprises two or more conjoined structures stacked on top of one another, in such a manner that the optical logic device (OLD) forms a chip- or disk-like component integrated from a plurality of structures.

33. An optical logic device according to claim 32, wherein between each stacked structure there is provided an optically, thermally or electrically insulating layer.

34. An optical logic device according to claim 30, wherein two or more optical logic elements (OLEs) which form a connected group in the structure are assigned to an optical detector which covers all the logic elements in the group.

35. An optical logic device according to claim 30, wherein each structure comprises one or more layers ($l_6$) with electrodes and electrical conductors assigned to each optical logic element (OLE) for accessing and addressing the optical logic device (OLD).

36. An optical logic device according to claim 35, wherein the layer or layers are entirely or partly composed of one or more conductive polymer materials which, integrated in the layer or layers, form the electrodes and the electrical conductors.

37. An optical logic device according to claim 30, wherein the structure is configured in its entirety or partly as an optical memory, each optical logic element (OLE) in the memory constituting a memory element which can be accessed and addressed individually.

38. An optical logic device according to claim 30, wherein the structure is partly configured as optical logic or arithmetic circuits, or networks of such circuits, or networks of such circuits, each optical logic element (OLE) in the circuits constituting a switching element can be accessed and addressed individually.

39. An optical logic device according to claim 30, wherein groups of the optical logic elements (OLES) in the structure are configured as memory registers, logic registers and arithmetic registers respectively, each optical element (OLE) in a register and each register being capable of being accessed and addressed individually, and in such a manner that the registers can be jointly configured to form an optical data processor.

40. An optical logic device according to claim 30, wherein accessing and addressing of the optical logic elements (OLEs) are performed via multiplexed communication lines assigned to the structure.

41. An optical logic device, especially for storing data or performing logic and arithmetic operations, comprising:

plural optical logic elements (OLEs), where the optical logic elements (OLEs) are particularly multistate, multistable optical logic elements, and even more particularly proximity-addressable optical logic elements, each said optical logic element including, an optical memory substance, wherein, under the influence of an impressed magnetic, electromagnetic or electrical field or supplied energy, the memory substance can transfer from one physical or chemical state to a second physical or chemical state, wherein a physical or chemical state is assigned a specific logic value and wherein a change in the logic element's physical or chemical state causes a change in the logic value and is implemented by the logic element being accessed and addressed magnetically, electromagnetically, electrically or optically for writing, reading, storing, erasing and switching of an assigned logic value;

an activator which generates a magnetic, electromagnetic or electrical field or supplies energy to the memory substance; and an optical detector for detection of the memory substance's optical response conditional on the memory substance's physical or chemical state;

the optical logic element (OLE) including the memory substance, activator and optical detector constituting a unitary integrated component;

the optical logic device (OLD) being assembled from the plural optical logic elements to form at least one structure with the optical memory substance, the activator, and the detector of each optical logic element (OLE) being merged together and connected with the memory substance, the activator and the detector in the surrounding logic elements (OLEs) to form a flat or curved surface body, each optical logic element (OLE) in the structure having an unambiguous assignment between the memory substance and the activator and an assignment between the memory substance and the optical detector for unambiguous detection of a physical or chemical state in the memory substance, thus enabling each optical logic element (OLE) in the structure to be accessed and addressed individually;

in each logic element (OLE) the memory substance being provided in the form of a first layer ($l_1$), the activator being provided in the form of a second layer ($l_2$) adjacent to the first layer ($l_1$) or provided integrated in the first layer ($l_1$), and the optical detector which detects the state of the memory substance being provided in the form of a third layer ($l_3$) adjacent to the first layer ($l_1$), the optical logic element (OLE) thus forming the integrated component, consisting essentially of at least three or two layers respectively $l_1$, $l_2$, $l_3$ or $l_1$, $l_3$), and that each of the layers ($l_1$, $l_2$, $l_3$) merges into and is connected with the corresponding layers ($l_1$, $l_2$, $l_3$ ) in the surrounding logic elements (OLEs), the structure thus forming a flat or curved surface body of connected and mutually adjacent respective layers ($l_1$, $l_2$, $l_3$, $l_1$, $l_2$).

42. An optical logic element (OLE) comprising:

an optical memory substance having first and second states assigned specific logic values and being detectable by an optical property thereof;

an activator supplying energy to said optical memory substance to change the optical memory substance between said first and second states;

an optical detector detecting the optical property of said optical memory substance to detect which of said first and second states of said optical memory substance is present;

said optical memory substance, activator, and optical detector being arranged into a multilayer unitary structure.

43. The optical logic element of claim 42 wherein said optical logic element is a multistate, multistable optical logic element.

44. The optical logic element of claim 43 wherein said optical logic element is a proximity-addressable optical logic element.

45. The optical logic element of claim 42 wherein the memory substance changes between said first and second states under the influence of an impressed magnetic, electromagnetic or electrical field or other supplied energy.

46. The optical logic element of claim 45 wherein said memory substance changes between said first and second states by changing between different physical or chemical states.

47. The optical logic element of claim 46 wherein said optical detector detects the memory substance's optical response to changes in the optical memory substance's physical or chemical state.

48. The optical logic element of claim 42 wherein said activator generates a magnetic, electromagnetic or electrical field or supplies other energy to the memory substance.

49. The optical logic element of claim 42 wherein said optical memory substance, activator, and optical detector are each provided in an individual layer of said mutlilayer unitary structure.

50. The optical logic element of claim 42 wherein said optical memory substance and activator are combined in a single layer of said mutlilayer unitary structure.

51. The optical logic element of claim 42 wherein said activator and optical detector are matrix accessed, said memory substance being arranged in plural individually addressable memory locations.

52. The optical logic element of claim 42 wherein plural optical elements are assembled into a optical logic device, the plural optical logic elements being assembled into a unitary memory structure.

* * * * *